United States Patent
Okuno et al.

(10) Patent No.: US 12,344,738 B2
(45) Date of Patent: Jul. 1, 2025

(54) RESIN COMPOSITION, FILM WITH RESIN, METAL FOIL WITH RESIN, METAL-CLAD LAMINATE, AND PRINTED WIRING BOARD

(71) Applicant: Panasonic Intellectual Property Management Co., Ltd., Osaka (JP)

(72) Inventors: Kosuke Okuno, Osaka (JP); Masaya Koyama, Mie (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 1 day.

(21) Appl. No.: 18/646,300

(22) Filed: Apr. 25, 2024

(65) Prior Publication Data

US 2024/0279458 A1  Aug. 22, 2024

Related U.S. Application Data

(63) Continuation of application No. PCT/JP2022/041663, filed on Nov. 9, 2022.

(30) Foreign Application Priority Data

Nov. 19, 2021  (JP) .................. 2021-188798

(51) Int. Cl.
C08L 53/00 (2006.01)
C08L 71/12 (2006.01)
(Continued)

(52) U.S. Cl.
CPC .............. *C08L 53/00* (2013.01); *C08L 71/12* (2013.01); *C09D 153/00* (2013.01); *C09D 171/12* (2013.01); *H05K 1/0373* (2013.01)

(58) Field of Classification Search
CPC ................................................ B32B 2457/08
See application file for complete search history.

(56) References Cited

U.S. PATENT DOCUMENTS

2006/0243947 A1* 11/2006 Tsumura ............... C08F 283/00
  252/299.01
2008/0254257 A1* 10/2008 Inoue ..................... C08J 5/244
  524/80
(Continued)

FOREIGN PATENT DOCUMENTS

JP  2005-105061  4/2005
JP  2015-086330  5/2015
(Continued)

OTHER PUBLICATIONS

Official Communication issued in International Patent Application No. PCT/JP2022/041663, dated Dec. 27, 2022, along with an English translation thereof.

*Primary Examiner* — Ian A Rummel
(74) *Attorney, Agent, or Firm* — GREENBLUM & BERNSTEIN, P.L.C.

(57) ABSTRACT

A resin composition contains a polyphenylene ether compound, a styrene block copolymer, a polybutadiene compound, and a curing agent. The polyphenylene ether compound has, in a molecule thereof, at least one of a group expressed by formula (1) or a group expressed by formula (2). The polybutadiene compound has an epoxy group in a molecule thereof. The curing agent contains an allyl compound expressed by formula (3). In the formula (1), p indicates an integer from 0 to 10, Z indicates an arylene group, and $R_1$ to $R_3$ each independently indicate either a hydrogen atom or an alkyl group. In the formula (2), $R_4$ indicates either a hydrogen atom or an alkyl group. In the formula (3), $R^A$ indicates either an alkyl group or an alkenyl group, each having 8 to 22 carbon atoms.

9 Claims, 4 Drawing Sheets

(51) Int. Cl.
*C09D 153/00* (2006.01)
*C09D 171/12* (2006.01)
*H05K 1/03* (2006.01)

(56) References Cited

U.S. PATENT DOCUMENTS

2016/0060429 A1 3/2016 Kitai et al.
2020/0270411 A1 8/2020 Kitai et al.
2022/0185960 A1 6/2022 Otsuka et al.
2022/0259424 A1 8/2022 Saito et al.

FOREIGN PATENT DOCUMENTS

WO 2019/065940 4/2019
WO 2020/196718 10/2020
WO 2021/010431 1/2021

* cited by examiner

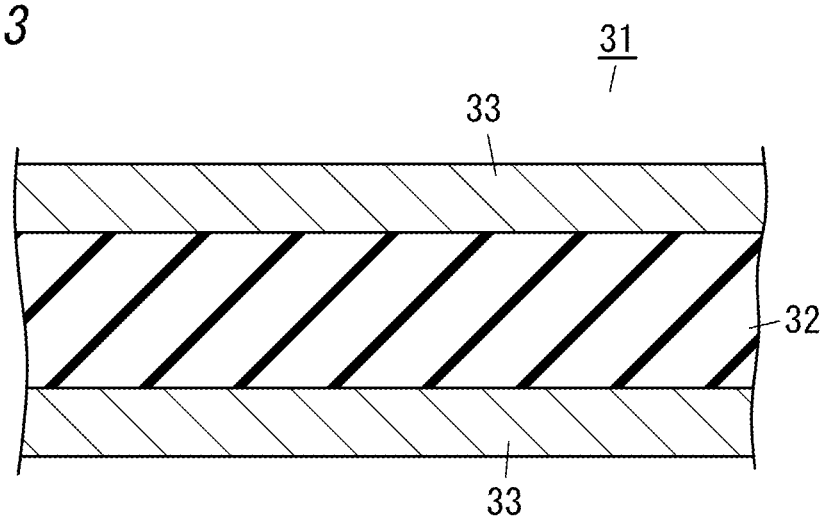

RESIN COMPOSITION, FILM WITH RESIN, METAL FOIL WITH RESIN, METAL-CLAD LAMINATE, AND PRINTED WIRING BOARD

CROSS-REFERENCE TO RELATED APPLICATIONS

The present application is a Bypass Continuation of International Application No. PCT/JP2022/041663 filed on Nov. 9, 2022, which is based upon, and claims the benefit of priority to, Japanese Patent Application No. 2021-188798, filed on Nov. 19, 2021. The entire contents of both applications are hereby incorporated by reference.

TECHNICAL FIELD

The present disclosure generally relates to a resin composition, a film with resin, a sheet of metal foil with resin, a metal-clad laminate, and a printed wiring board. More particularly, the present disclosure relates to a resin composition, and also relates to a film with resin, a sheet of metal foil with resin, a metal-clad laminate, and a printed wiring board, all of which are made out of the resin composition.

BACKGROUND ART

JP 2015-086330 A discloses a resin composition containing a modified polyphenylene ether compound and triallyl isocyanurate (hereinafter also referred to as "TAIC") as a cross-linking curing agent having a carbon-carbon unsaturated double bond. JP 2015-086330 A describes that this resin composition may provide a cured product having excellent low dielectric properties.

SUMMARY

The present disclosure provides a resin composition which enables providing a cured product having low dielectric properties and yet having sufficient flexibility and excellent adhesiveness to a sheet of metal foil, for example, and also provides a film with resin including a resin layer made of the resin composition, a sheet of metal foil with resin including a resin layer made of the resin composition, a metal-clad laminate including an insulating layer made of the resin composition, and a printed wiring board including an insulating layer made of the resin composition.

A resin composition according to an aspect of the present disclosure contains a polyphenylene ether compound (A), a styrene block copolymer (B), a polybutadiene compound (C), and a curing agent (D). The polyphenylene ether compound (A) has, in a molecule thereof, at least one of a group expressed by the following formula (1) or a group expressed by the following formula (2):

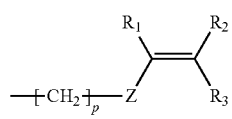
(1)

In the formula (1), p indicates an integer falling within a range from 0 to 10, Z indicates an arylene group, and $R_1$ to $R_3$ each independently indicate either a hydrogen atom or an alkyl group.

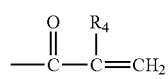
(2)

In the formula (2), $R_4$ indicates either a hydrogen atom or an alkyl group. The polybutadiene compound (C) has an epoxy group in a molecule thereof. The curing agent (D) contains an allyl compound (d1) expressed by the following formula (3):

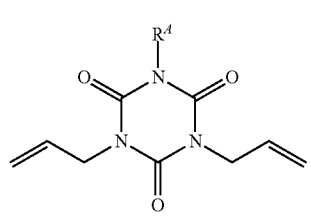
(3)

In the formula (3), $R^A$ indicates either an alkyl group or an alkenyl group, each having 8 to 22 carbon atoms.

A film with resin according to another aspect of the present disclosure includes: a resin layer containing at least one of an uncured product of the resin composition described above or a semi-cured product of the resin composition described above; and a supporting film laid on top of the resin layer.

A sheet of metal foil with resin according to still another aspect of the present disclosure includes: a resin layer containing at least one of an uncured product of the resin composition described above or a semi-cured product of the resin composition described above; and a sheet of metal foil laid on top of the resin layer.

A metal-clad laminate according to yet another aspect of the present disclosure includes: an insulating layer containing a cured product of the resin composition described above; and a sheet of metal foil laid on top of the insulating layer.

A printed wiring board according to yet another aspect of the present disclosure includes: an insulating layer containing a cured product of the resin composition described above; and wiring covered with the insulating layer.

BRIEF DESCRIPTION OF DRAWINGS

The figures depict one or more implementations in accordance with the present teaching, by way of example only, not by way of limitations. In the figures, like reference numerals refer to the same or similar elements.

FIG. 3 is a schematic cross-sectional view illustrating an exemplary metal-clad laminate according to the exemplary embodiment of the present disclosure.

DETAILED DESCRIPTION

Figure 1:
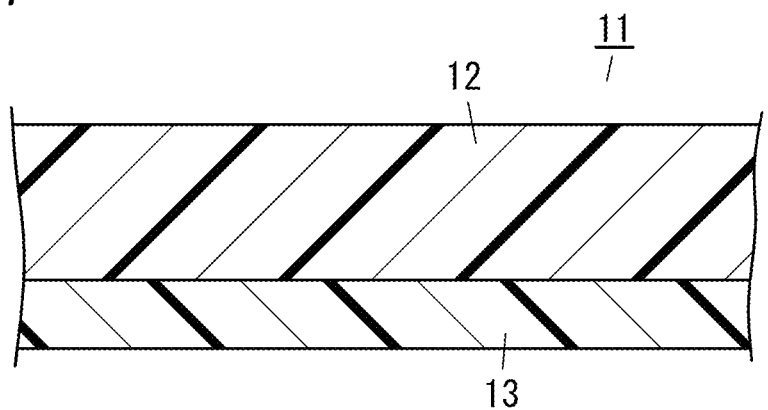
FIG. 1 is a schematic cross-sectional view illustrating an exemplary film with resin according to an exemplary embodiment of the present disclosure.

First, it will be described how the present inventors conceived the concept of the present disclosure.

Recently, as the amount of information to be processed by various types of electronic devices has been on the rise, mounting technologies have been developed increasingly remarkably for the purpose of integrating semiconductor devices, and forming wiring, more and more densely on those devices and further increasing the number of interconnection layers to be stacked one on top of another in those devices. Meanwhile, wiring boards for use in those various types of electronic devices are required to be compatible with radio-frequency applications as in a millimeter wave radar board for onboard applications. To increase the transmission rate of signals and cut down the transmission loss of the signals, board materials for use to form the insulating layer of a wiring board to be applied to those various types of electronic devices are required to have their dielectric constant and dielectric loss tangent lowered as much as possible.

It is known that polyphenylene ether exhibits excellent low dielectric properties on radio-frequency bands in the range from MHz band to GHz band. That is why polyphenylene ether may be used as a radio-frequency molding material, for example. More specifically, polyphenylene ether is suitably used as a board material to form an insulating layer of a printed wiring board provided for an electronic device that uses the radio-frequency band.

JP 2015-086330 A cited above discloses a resin composition containing a modified polyphenylene ether compound and triallyl isocyanurate (hereinafter also referred to as "TAIC") as a cross-linking curing agent having a carbon-carbon unsaturated double bond. JP 2015-086330 A describes that this resin composition may provide a cured product having excellent low dielectric properties.

In recent years, a cured product of a resin composition is increasingly required to have not only low dielectric properties but also sufficient flexibility and improved adhesiveness to a sheet of metal foil.

In view of the foregoing background, the present inventors carried out extensive research and development. As a result, the present inventors conceived the concept of a resin composition, of which the cured product would have low dielectric properties and yet have sufficient flexibility and excellent adhesiveness to a sheet of metal foil, for example.

An exemplary embodiment of the present disclosure will now be described. Note that the exemplary embodiment to be described below is only an exemplary one of various embodiments of the present disclosure and should not be construed as limiting. Rather, the exemplary embodiment may be readily modified in various manners depending on a design choice or any other factor without departing from the scope of the present disclosure.

<Resin composition>

A resin composition according to this embodiment (hereinafter simply referred to as a "resin composition") contains a polyphenylene ether compound (A), a styrene block copolymer (B), a polybutadiene compound (C), and a curing agent (D). The polyphenylene ether compound (A) has, in a molecule thereof, at least one of a group expressed by the following formula (1) or a group expressed by the following formula (2):

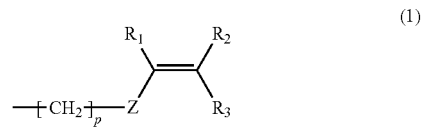

(1)

In the formula (1), p indicates an integer falling within a range from 0 to 10, Z indicates an arylene group, and $R_1$ to $R_3$ each independently indicate either a hydrogen atom or an alkyl group.

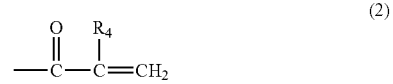

(2)

In the formula (2), $R_4$ indicates either a hydrogen atom or an alkyl group. The polybutadiene compound (C) has an epoxy group in a molecule thereof. The curing agent (D) contains an allyl compound (d1) expressed by the following formula (3):

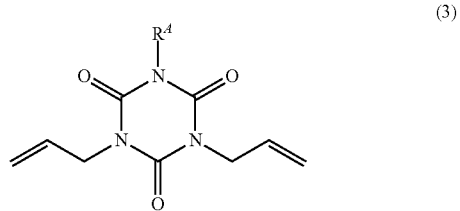

(3)

In the formula (3), $R^A$ indicates either an alkyl group or an alkenyl group, each having 8 to 22 carbon atoms.

The resin composition according to this embodiment contains the polyphenylene ether compound (A), thus enabling providing a cured product with low dielectric properties. In addition, the resin composition also contains the styrene block copolymer (B) and the polybutadiene compound (C) having an epoxy group in its molecule, thus enabling providing a cured product with excellent adhesiveness to a sheet of metal foil, for example. Besides, the resin composition further contains the curing agent (D) having the allyl compound (d1), thus enabling providing a cured product with sufficient flexibility while maintaining low dielectric properties and excellent adhesiveness to a sheet of metal foil, for example.

Consequently, the resin composition according to this embodiment may provide a cured product having low dielectric properties and yet having sufficient flexibility and excellent adhesiveness to a sheet of metal foil, for example.

Manufacturing a film with resin using this resin composition would provide a film with resin including a resin layer having low dielectric properties and yet having sufficient flexibility and excellent adhesiveness to a sheet of metal foil, for example. In addition, manufacturing a sheet of metal foil with resin using this resin composition would provide a sheet of metal foil with resin including a resin layer having low dielectric properties and yet having sufficient flexibility and excellent adhesiveness to a sheet of metal foil, for example. Furthermore, manufacturing a metal-clad laminate using this resin composition would provide a metal-clad laminate including an insulating layer having low dielectric properties and yet having sufficient flexibility and excellent adhesiveness to a sheet of metal foil, for example. Furthermore, manufacturing a printed wiring board using this resin composition would provide a printed wiring board including an insulating layer having low dielectric properties and yet having sufficient flexibility and excellent adhesiveness to a sheet of metal foil, for example.

Next, the chemical makeup of the resin composition according to this embodiment will be described in detail.
(Polyphenylene ether)

The resin composition according to this embodiment contains a polyphenylene ether compound (A) as described above. The polyphenylene ether compound (A) has, in its molecule, at least one of the group expressed by the formula (1) or the group expressed by the formula (2). In addition, the polyphenylene ether compound (A) preferably has, at either terminal or both terminals of its molecule, at least one of the group expressed by the formula (1) or the group expressed by the formula (2). That is to say, the resin composition according to this embodiment preferably contains a polyphenylene ether compound (A), of which one terminal is modified with at least one of the group expressed by the formula (1) or the group expressed by the formula (2).

As described above, in the formula (1), p indicates an integer falling within the range from 0 to 10, Z indicates an arylene group, and $R_1$ to $R_3$ are independent of each other. That is to say, $R_1$ to $R_3$ may be the same group or different from each other, whichever is appropriate. In addition, $R_1$ to $R_3$ indicate either a hydrogen atom or an alkyl group.

Note that if p is zero in the formula (1), this means that Z is directly bonded to the terminal of the polyphenylene ether.

If each of $R_1$ to $R_3$ in the formula (1) is an alkyl group, then each of $R_1$ to $R_3$ is preferably an alkyl group having 1 to 18 carbon atoms, for example, and more preferably an alkyl group having 1 to 10 carbon atoms. Specific examples of such an alkyl group include a methyl group, an ethyl group, a propyl group, a hexyl group, and a decyl group.

The arylene group may be, for example, a monocyclic aromatic group such as a phenylene group, or a polycyclic aromatic group such as a naphthylene ring which is a polycyclic aromatic compound. Also, in an aromatic ring included in the arylene group, a hydrogen atom directly bonded to the aromatic ring may be replaced with a substituent other than a hydrogen atom. Specific examples of such substituents include an alkenyl group, an alkynyl group, a formyl group, an alkylcarbonyl group, an alkenylcarbonyl group, and an alkynylcarbonyl group. The alkyl group bonded to the aromatic ring is preferably an alkyl group having 1 to 18 carbon atoms, and more preferably an alkyl group having 1 to 10 carbon atoms, for example. More specifically, the alkyl group may be, for example, a methyl group, an ethyl group, a propyl group, a hexyl group, or a decyl group.

Specific examples of the group expressed by the formula (1) include a vinylbenzyl group expressed by the following formula (4) and a vinylphenyl group. More specific examples of the vinylbenzyl group include an o-ethenylbenzyl group, an m-ethenylbenzyl group, and a p-ethenylbenzyl group.

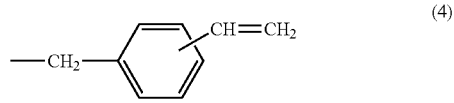

In the formula (2), $R_4$ is either a hydrogen atom or an alkyl group. If $R_4$ is an alkyl group, then $R_4$ is preferably an alkyl group having 1 to 18 carbon atoms and more preferably an alkyl group having 1 to 10 carbon atoms, for example. Specific examples of such an alkyl group include a methyl group, an ethyl group, a propyl group, a hexyl group, and a decyl group.

Also, specific examples of the group expressed by the formula (2) include an acryloyl group and a methacryloyl group.

As described above, the polyphenylene ether compound (A) has, in its molecule, at least one of the group expressed by the formula (1) or the group expressed by the formula (2). That is to say, the polyphenylene ether compound (A) may have only one type of group or two or more types of groups selected from the group consisting of the group expressed by the formula (1) and the group expressed by the formula (2). More specifically, the polyphenylene ether compound (A) may have, for example, any one, or two or more, selected from the group consisting of an o-ethenylbenzyl group, an m-ethenylbenzyl group, and a p-ethenylbenzyl group.

The polyphenylene ether compound (A) is a compound having a polyphenylene ether chain in its molecule. The polyphenylene ether compound (A) preferably has, in its molecule, a constitutional repeating unit expressed by, for example, the following formula (5):

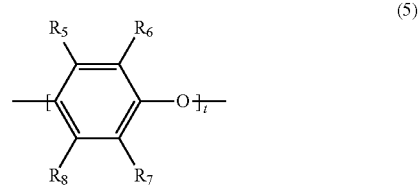

In the formula (5), t falls within the range from 1 to 50 and $R_5$ to $R_8$ are independent of each other. That is to say, $R_5$ to $R_8$ may be the same group or different from each other, whichever is appropriate.

Also, examples of $R_5$ to $R_8$ in the formula (5) include a hydrogen atom, an alkyl group, an alkenyl group, an alkynyl group, a formyl group, an alkylcarbonyl group, an alkenylcarbonyl group, and an alkynylcarbonyl group. Among other things, each of $R_5$ to $R_8$ is preferably either a hydrogen atom or an alkyl group.

The group included in $R_5$ to $R_8$ will be described in further detail.

The alkyl group is preferably an alkyl group having 1 to 18 carbon atoms, and more preferably an alkyl group having 1 to 10 carbon atoms. Specific examples of such an alkyl group include a methyl group, an ethyl group, a propyl group, a hexyl group, and a decyl group.

The alkenyl group is preferably an alkenyl group having 2 to 18 carbon atoms, and more preferably an alkenyl group having 2 to 10 carbon atoms. Specific examples of such an alkenyl group include a vinyl group, an allyl group, and a 3-butenyl group.

The alkynyl group is preferably an alkynyl group having 2 to 18 carbon atoms, and more preferably an alkynyl group having 2 to 10 carbon atoms, for example. Specific examples of such an alkynyl group include an ethynyl group and a propargyl group (propa-2-in-1-yl group).

The alkylcarbonyl group may be a carbonyl group replaced with an alkyl group and is preferably an alkylcarbonyl group having 2 to 18 carbon atoms and more preferably an alkylcarbonyl group having 2 to 10 carbon atoms. Specific examples of such an alkylcarbonyl group include an acetyl group, a propionyl group, a butyryl group, an isobutyryl group, a pivaloyl group, a hexanoyl group, an octanoyl group, and a cyclohexylcarbonyl group.

The alkenylcarbonyl group may be a carbonyl group replaced with an alkenyl group and is preferably an alkenylcarbonyl group having 3 to 18 carbon atoms, and more preferably an alkenylcarbonyl group having 3 to 10 carbon atoms, for example. Specific examples of such an alkenylcarbonyl group include an acryloyl group, a methacryloyl group, and a crotonoyl group.

The alkynylcarbonyl group may be a carbonyl group replaced with an alkynyl group and is preferably an alkynylcarbonyl group having 3 to 18 carbon atoms, and more preferably an alkynylcarbonyl group having 3 to 10 carbon atoms, for example. Specific examples of such an alkynylcarbonyl group include a propioloyl group.

The weight average molecular weight (Mw) of the polyphenylene ether compound (A) is preferably equal to or greater than 500, more preferably equal to or greater than 800, and even more preferably equal to or greater than 1000. Also, the weight average molecular weight (Mw) of the polyphenylene ether compound (A) is preferably equal to or less than 5000, more preferably equal to or less than 4000, and even more preferably equal to or less than 3000. If the weight average molecular weight (Mw) of the polyphenylene ether compound (A) falls within this numerical value range from 500 to 5000, the resin composition may provide a cured product having low dielectric properties and yet having sufficient flexibility and excellent adhesiveness to a sheet of metal foil, for example.

In this case, the weight average molecular weight may be measured by any general molecular weight measuring method without limitation. Specifically, the weight average molecular weight is preferably measured using, for example, a gel permeation chromatography (GPC). Also, if the polyphenylene ether compound (A) has the constitutional repeating unit expressed by the formula (5) in its molecule, t in the formula (5) is preferably a numerical value that allows the weight average molecular weight of the polyphenylene ether compound (A) to fall within the above-defined range. Specifically, in that case, the value of t preferably falls within the range from 1 to 50, for example.

As described above, the polyphenylene ether compound (A) according to this embodiment has, in its molecule, at least one of the group expressed by the formula (1) or the group expressed by the formula (2). Thus, the resin composition according to this embodiment may provide, even if the weight average molecular weight of the polyphenylene ether compound (A) falls within the numerical value range from 500 to 5000, which are relatively low molecular weights, a cured product having low dielectric properties and yet having sufficient flexibility and excellent adhesiveness to a sheet of metal foil, for example.

In the polyphenylene ether compound (A), the average number of groups per molecule of the polyphenylene ether compound (A), which is represented by at least one of the group expressed by the formula (1) or the group expressed by the formula (2), preferably falls within the range from 1 to 5, more preferably falls within the range from 1 to 3, and even more preferably falls within the range from 1.5 to 3, for example. If the number of groups per molecule of the polyphenylene ether compound (A) falls within the numerical value range from 1 to 5, the resin composition according to this embodiment may provide a cured product having low dielectric properties and yet having sufficient flexibility and excellent adhesiveness to a sheet of metal foil, for example.

Note that in the polyphenylene ether compound (A), the average number of groups per molecule of the polyphenylene ether compound (A), which is represented by at least one of the group expressed by the formula (1) or the group expressed by the formula (2), may be, for example, a numerical value indicating, per molecule of every polyphenylene ether compound (A) present in 1 mole of the polyphenylene ether compound (A), the average value represented by at least one of the group expressed by the formula (1) or the group expressed by the formula (2). The average value of this group may be obtained by, for example, measuring the number of hydroxyl groups remaining in the polyphenylene ether compound (A) produced and calculating the decrease in the number of hydroxyl groups from the number of hydroxyl groups of the polyphenylene ether that has no groups expressed by the formula (1) or the formula (2) yet, i.e., the polyphenylene ether, of which the terminal has not been modified yet with the group expressed by the formula (1) or the group expressed by the formula (2).

Also, the number of hydroxyl groups remaining in the polyphenylene ether compound (A) may be determined by, for example, adding a quaternary ammonium salt (tetraethylammonium hydroxide) that associates with hydroxyl groups to the solution of the polyphenylene ether compound (A) and measuring the UV absorbance of a mixed solution.

The intrinsic viscosity of the polyphenylene ether compound (A) according to this embodiment is preferably equal to or greater than 0.03 dl/g, more preferably equal to or greater than 0.04 dl/g, and even more preferably equal to or greater than 0.06 dl/g. The intrinsic viscosity of the polyphenylene ether compound (A) according to this embodiment is preferably equal to or less than 0.12 dl/g, more preferably equal to or less than 0.11 dl/g, and even more preferably equal to or less than 0.095 dl/g. If the intrinsic viscosity of the polyphenylene ether compound (A) falls within this numerical value range from 0.03 dl/g to 0.12 dl/g, the resin composition may provide a cured product having low dielectric properties and yet having sufficient flexibility and excellent adhesiveness to a sheet of metal foil, for example.

Note that in this case, the intrinsic viscosity of the polyphenylene ether compound (A) is measured in methylene chloride at 25° C. More specifically, the intrinsic viscosity of the polyphenylene ether compound (A) may be, for example, a value measured with a viscometer by dissolving the polyphenylene ether compound (A) in methylene chloride to prepare a methylene chloride solution having a concentration of 0.18 g/45 mL and adjusting the liquid temperature of the methylene chloride solution to 25° C. The viscometer that may be used to measure the intrinsic viscosity may be, for example, AVS500 Visco System manufactured by Schott Instruments GmbH.

The polyphenylene ether compound (A) preferably includes at least one compound selected from the group consisting of a polyphenylene ether compound (a1) having the structure expressed by the following formula (6), a polyphenylene ether compound (a2) having the structure expressed by the following formula (7), and a polyphenylene ether compound (a3) having the structure expressed by the following formula (8). That is to say, the polyphenylene ether compound (A) may include any one, or two or more, selected from the group consisting of the polyphenylene ether compound (a1) having the structure expressed by the following formula (6), the polyphenylene ether compound (a2) having the structure expressed by the following formula (7), and the polyphenylene ether compound (a3) having the structure expressed by the following formula (8).

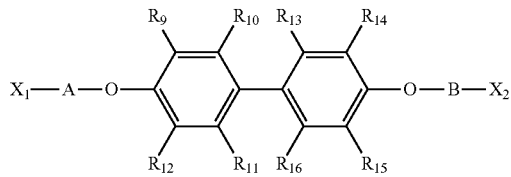
(6)

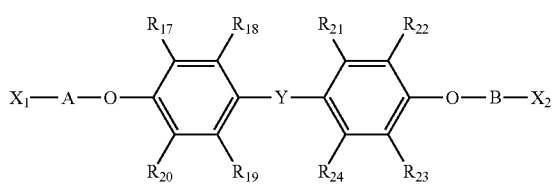
(7)

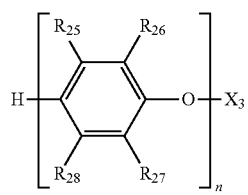
(8)

In these formulae (6), (7), and (8), $R_9$-$R_{16}$, $R_{17}$-$R_{24}$, and $R_{25}$-$R_{28}$ are independent of each other. That is to say, $R_9$-$R_{16}$, $R_{17}$-$R_{24}$, and $R_{25}$-$R_{28}$ may be the same group or different from each other, whichever is appropriate.

Also, in these formulae (6), (7), and (8), examples of $R_9$-$R_{16}$, $R_{17}$-$R_{24}$, and $R_{25}$-$R_{28}$ include a hydrogen atom, an alkyl group, an alkenyl group, an alkynyl group, a formyl group, an alkylcarbonyl group, an alkenylcarbonyl group, and an alkynylcarbonyl group. Among other things, $R_9$-$R_{16}$, $R_{17}$-$R_{24}$, and $R_{25}$-$R_{28}$ are preferably a hydrogen atom or an alkyl group.

Furthermore, in these formulae (6), (7), and (8), X1-X3 are independent of each other. That is to say, X1-X3 may be the same group or different from each other, whichever is appropriate. X1-X3 are preferably either the group expressed by the formula (1), or the group expressed by the formula (2).

In the formula (8), s is an integer falling within the range from 1 to 100, for example.

In addition, A and B in the formulae (6) and (7) each have a constitutional repeating unit expressed by at least one of the following formulae (9) and (10):

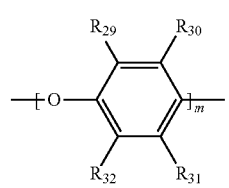
(9)

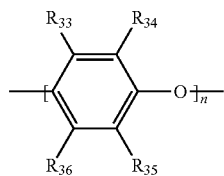
(10)

In the formulae (9) and (10), m and n each fall within the range from 0 to 20, for example.

In these formulae (9) and (10), $R_{29}$-$R_{32}$ and $R_{33}$-$R_{36}$ are independent of each other. That is to say, $R_{29}$-$R_{32}$ and $R_{33}$-$R_{36}$ may be the same group or different from each other, whichever is appropriate.

Also, in these formulae (9) and (10), examples of $R_{29}$-$R_{32}$ and $R_{33}$-$R_{36}$ include a hydrogen atom, an alkyl group, an alkenyl group, an alkynyl group, a formyl group, an alkylcarbonyl group, an alkenylcarbonyl group, and an alkynylcarbonyl group. Among other things, $R_{29}$-$R_{32}$ and $R_{33}$-$R_{36}$ are preferably a hydrogen atom or an alkyl group.

In these formulae (9) and (10), m and n are preferably numerical values, of which the sum falls within the range from 1 to 30. That is to say, m preferably falls within the range from 0 to 20, n preferably falls within the range from 0 to 20, and the sum of m and n preferably falls within the range from 1 to 30.

Also, $R_{29}$-$R_{32}$ may be the same as $R_5$-$R_8$ in the formula (5).

In the formula (7), Y is preferably straight-chain, branched, or cyclic hydrocarbon having at most 20 carbons. A specific exemplary structure of this hydrocarbon Y may be, for example, the group expressed by the following formula (11):

(11)

In this formula (11), $R_{37}$ and $R_{38}$ are independent of each other. That is to say, $R_{37}$ and $R_{38}$ may be the same group or different from each other, whichever is appropriate.

Also, in this formula (11), $R_{37}$ and $R_{38}$ may be a hydrogen atom or an alkyl group, for example. Specifically, this alkyl group may be a methyl group, for example. Specific examples of the group expressed by this formula (11) include a methylene group, a methyl methylene group, and a dimethyl methylene group. Among other things, the group expressed by the formula (11) is preferably a dimethyl methylene group.

A more specific example of the polyphenylene ether compound (a1) expressed by the formula (6) may be a polyphenylene ether compound (a11) expressed by the following formula (12):

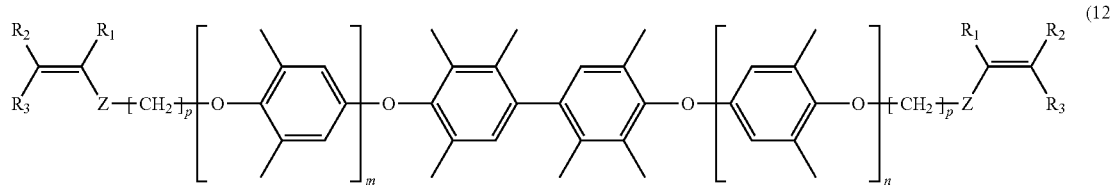

(12)

More specific examples of the polyphenylene ether compound (a2) expressed by the formula (7) include a polyphenylene ether compound (a21) expressed by the following formula (13) and a polyphenylene ether compound (a22) expressed by the following formula (14):

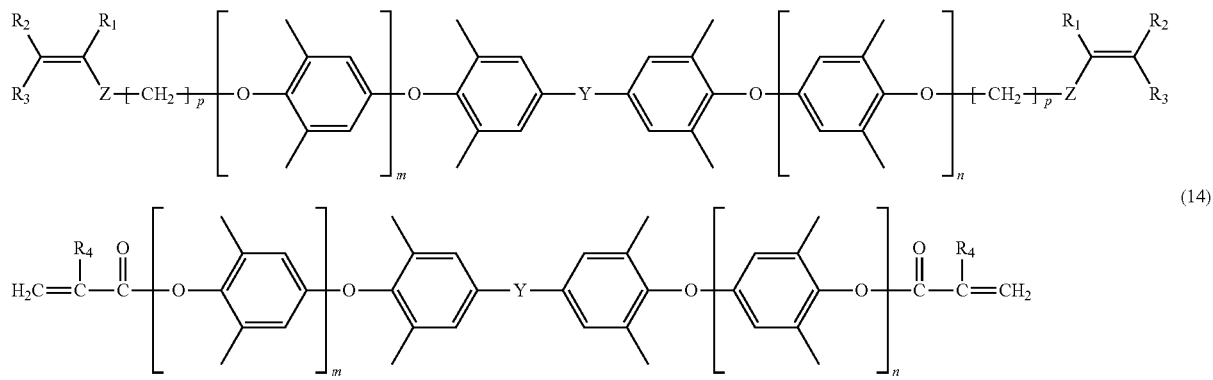

In these formulae (12), (13), and (14), m and n may be the same as m and n in the formulae (9) and (10), for example. Also, in the formulae (12) and (13), $R_1$-$R_3$, p, and Z may be the same as $R_1$-$R_3$, p, and Z in the formula (1), for example. Furthermore, in the formulae (13) and (14), Y is may be the same as Y in the formula (7), for example. In the formula (14), $R_4$ may be the same as $R_4$ in the formula (2), for example.

Next, a method for synthesizing the polyphenylene ether compound (A) according to this embodiment will be described. In the following description, a method for synthesizing a modified polyphenylene ether compound (A), of which one terminal is modified with at least one of the group expressed by the formula (1) or the group expressed by the formula (2) will be described. However, the method for synthesizing the polyphenylene ether compound (A) according to this embodiment to be described below is only an example and should not be construed as limiting. Rather, any other suitable method may also be used as long as the method enables synthesizing a polyphenylene ether compound (A) including, in its molecule, at least one of the group expressed by the formula (1) or the group expressed by the formula (2).

The method for synthesizing a modified polyphenylene ether compound (A), of which at least one terminal is modified with at least one of the group expressed by the formula (1) or the group expressed by the formula (2), may include, for example, allowing the polyphenylene ether compound as a material to react with a compound including at least one of the group expressed by the formula (1) or the group expressed by the formula (2) and a halogen atom.

Examples of the halogen atom include a chlorine atom, a bromine atom, an iodine atom, and a fluorine atom. Among other things, the halogen atom is preferably a chlorine atom. Specific examples of the compound including at least one of the group expressed by the formula (1) or the group expressed by the formula (2) and the halogen atom include o-chloromethylstyrene, p-chloromethylstyrene, and m-chloromethylstyrene.

Only one type of such a compound including at least one of the group expressed by the formula (1) or the group expressed by the formula (2) and the halogen atom may be used by itself, for example. Alternatively, two or more types of such compounds may also be used in combination. More specifically, any one compound selected from the group consisting of o-chloromethylstyrene, p-chloromethylstyrene, and m-chloromethylstyrene may be used by itself.

Alternatively, two or more compounds selected from the group consisting of o-chloromethylstyrene, p-chloromethylstyrene, and m-chloromethylstyrene may also be used in combination.

In the method for synthesizing the polyphenylene ether compound (A) according to this embodiment, any polyphenylene ether may be used without limitation as its material as long as the desired polyphenylene ether compound (A) may be eventually synthesized. Specific examples of the material polyphenylene ether include a polyphenylene ether including at least one of 2,6-dimethylphenol, a bifunctional phenol, or a trifunctional phenol and a polyphenylene ether such as poly(2,6-dimethyl-1,4-phenylene oxide).

As used herein, the bifunctional phenol refers to a phenol compound having two phenolic hydroxyl groups in its molecule. Specific examples of the bifunctional phenol include tetramethyl bisphenol A. As used herein, the trifunctional phenol refers to a phenol compound having three phenolic hydroxyl groups in its molecule.

As described above, the method for synthesizing the polyphenylene ether compound (A) according to this embodiment preferably includes allowing the material polyphenylene ether compound to react with a compound including at least one of the group expressed by the formula (1) or the group expressed by the formula (2) and the halogen atom. More specifically, the method for synthesizing the polyphenylene ether compound (A) preferably includes a reaction process step in which the material polyphenylene ether and the compound including at least one of the group expressed by the formula (1) or the group expressed by the formula (2) and the halogen atom are allowed to react with each other by dissolving these components in a solvent and stirring up the mixture while heating the mixture.

In the method for synthesizing the polyphenylene ether compound (A) according to this embodiment, the reaction process step is preferably performed in the presence of an alkali metal hydroxide. This allows the polyphenylene ether and the compound including at least one of the group expressed by the formula (1) or the group expressed by the formula (2) and the halogen atom to react with each other smoothly. Specific examples of the alkali metal hydroxides include sodium hydroxide. Also, the alkali metal hydroxide is preferably used in the form of an aqueous solution. That is to say, in the method for synthesizing the polyphenylene ether compound (A) according to this embodiment, the reaction process step preferably includes using an aqueous solution of sodium hydroxide.

In the reaction process step of the method for synthesizing the polyphenylene ether compound (A) according to this embodiment, a reaction condition that allows the material polyphenylene ether and the compound including at least one of the group expressed by the formula (1) or the group expressed by the formula (2) and the halogen atom to react with each other smoothly is preferably set.

In the reaction process step, the reaction temperature is preferably equal to or higher than 20° C. and equal to or lower than 100° C., and more preferably equal to or higher than 30° C. and equal to or lower than 100° C., for example. Also, in the reaction process step, the reaction duration is preferably equal to or longer than 0.5 hours and equal to or shorter than 20 hours and more preferably equal to or longer than 0.5 hours and equal to or shorter than 10 hours, for example.

In the method for synthesizing the polyphenylene ether compound (A) according to this embodiment, the solvent for use in the reaction process step is preferably able to, for example, dissolve the material polyphenylene ether and the compound including at least one of the group expressed by the formula (1) or the group expressed by the formula (2) and the halogen atom without impeding their reaction. Specific examples of such a solvent include toluene.

In the method for synthesizing the polyphenylene ether compound (A) according to this embodiment, if the alkali metal hydroxide is used in the reaction process step, the alkali metal hydroxide and a phase transfer catalyst are preferably used in combination. That is to say, the material polyphenylene ether and the compound including at least one of the group expressed by the formula (1) or the group expressed by the formula (2) and the halogen atom are preferably allowed to react with each other in the presence of the alkali metal hydroxide and the phase transfer catalyst. This allows the material polyphenylene ether and the compound including at least one of the group expressed by the formula (1) or the group expressed by the formula (2) and the halogen atom to react with each other more smoothly. Specific examples of the phase transfer catalyst include quaternary ammonium salts such as tetra-n-butylammonium bromide.

(Styrene block copolymer)

The resin composition according to this embodiment contains the styrene block copolymer (B) as described above.

The styrene block copolymer (B) is preferably a resin included the resin composition, for example, for use to make an insulating layer included in a metal-clad laminate or a printed wiring board, for example. Such a styrene block copolymer (B) includes at least one selected from the group consisting of, for example, methylstyrene (ethylene/butylene)-methylstyrene copolymers, methylstyrene (ethylene-ethylene/propylene)-methylstyrene copolymers, styrene-isoprene copolymers, styrene-isoprene-styrene copolymers, styrene (ethylene/butylene)-styrene copolymers, styrene (ethylene-ethylene/propylene)-styrene copolymers, styrene-butadiene-styrene copolymers, styrene (butadiene/butylene)-styrene copolymers, styrene-isobutylene-styrene copolymers, and hydrogenated products thereof. Also, the styrene block copolymer (B) according to this embodiment preferably includes at least one selected from the group consisting of, for example, styrene-butadiene-styrene copolymers, styrene (ethylene/butylene)-styrene copolymers, methylstyrene (ethylene/butylene)-methylstyrene copolymers, and hydrogenated products thereof.

Only one type of styrene block copolymer (B) according to this embodiment may be used by itself. Alternatively, two or more types of styrene block copolymers (B) according to this embodiment may also be used in combination.

The styrene block copolymer (B) according to this embodiment preferably has a weight average molecular weight equal to or greater than 10,000, more preferably equal to or greater than 50,000, and even more preferably equal to or greater than 60,000. Meanwhile, the styrene block copolymer (B) according to this embodiment preferably has a weight average molecular weight equal to or less than 300,000, more preferably equal to or less than 250,000, and even more preferably equal to or less than 200,000. Setting the weight average molecular weight of the styrene block copolymer (B) at a value falling within the numerical value range from 10,000 to 300,000 allows the resin composition according to this embodiment to provide a cured product having low dielectric properties and yet having sufficient flexibility and excellent adhesiveness to a sheet of metal foil, for example.

(Polybutadiene compound)

The resin composition according to this embodiment contains the polybutadiene compound (C) as described above. The polybutadiene compound (C) has an epoxy group in its molecule. Specific examples of such a polybutadiene compound (C) include a compound in which an epoxy group is introduced into the molecule by epoxidizing at least part of a carbon-carbon double bond in the polybutadiene and a compound in which both terminals of polybutadiene are glycidyl-etherified. Such a compound in which an epoxy group is introduced into the molecule by epoxidizing at least a part of the carbon-carbon double bond in polybutadiene may be produced by introducing a three-membered ring epoxy group by adding, using an epoxidizing agent, one oxygen atom to the carbon-carbon double bond in non-epoxidized polybutadiene. A compound in which both terminals of polybutadiene are glycidyl-etherified may be obtained, for example, by adding epichlorohydrin to polybutadiene having hydroxyl groups at both terminals.

Also, the non-epoxidized polybutadiene may have, for example, any of cis-1,4, trans-1,4, cis-1,2, or trans-1,2 steric structure of carbon-carbon double bonds. In addition, the ratio of these steric structures is preferably set at such a ratio that allows the resin composition according to this embodiment to provide a cured product having low dielectric properties and yet having sufficient flexibility and excellent adhesiveness to a sheet of metal foil, for example.

The epoxidizing agent is preferably able to epoxidize the carbon-carbon double bonds in polybutadiene. Specific exemplary compounds for use as such an epoxidizing agent include percarboxylic acids such as peracetic acid, performic acid, perbenzoic acid, trifluoro peracetic acid, and perpropionic acid, organic hydroperoxides such as t-butyl hydroperoxide and cumene. hydroperoxides, and hydrogen peroxide.

The percentage of oxirane oxygen in the polybutadiene compound (C) is preferably equal to or greater than 1% by mass and more preferably equal to or greater than 5% by mass. Also, the percentage of oxirane oxygen in the polybutadiene compound (C) is preferably equal to or less than 10% by mass and more preferably equal to or less than 9% by mass. Setting the percentage of the oxirane oxygen at a value falling within the numerical value range from 1% by mass to 10% by mass allows the resin composition according to this embodiment to provide a cured product having low dielectric properties and yet having sufficient flexibility and excellent adhesiveness to a sheet of metal foil, for example.

(Curing agent)

The resin composition according to this embodiment contains the curing agent (D) as described above. The curing agent (D) contained in the resin composition according to this embodiment includes an allyl compound (d1) expressed by the following formula (3). Allowing the curing agent (D) to react with the polyphenylene ether compound (A), for example, causes the resin composition containing the polyphenylene ether compound (A) to be cured.

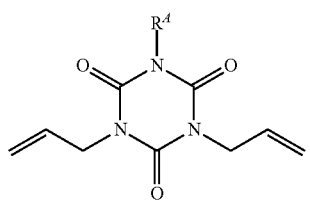

(3)

In this formula (3), $R^A$ indicates either an alkyl group or an alkenyl group, each having 8 to 22 carbon atoms. The resin composition according to this embodiment contains the allyl compound (d1) having an alkyl group or alkenyl group with this number of carbon atoms, and therefore, may provide a cured product having low dielectric properties and yet having sufficient flexibility and excellent adhesiveness to a sheet of metal foil, for example.

Also, in this formula (3), the number of carbon atoms of $R^A$ is more preferably equal to or greater than 12 and equal to or less than 18 from the viewpoint of improving the handleability. This improves the flowability of the resin composition and makes it easier to mold this resin composition. This allows the resin composition according to this embodiment to have low dielectric properties and yet have sufficient flexibility and excellent adhesiveness to a sheet of metal foil, for example.

The double bond equivalent (reactive group equivalent) of the allyl compound (d1) according to this embodiment is preferably equal to or less than 1,000. Setting the double bond equivalent (reactive group equivalent) of the allyl compound (d1) at a value equal to or less than 1,000 allows the resin composition according to this embodiment to achieve a high Tg and provide a cured product having low dielectric properties and yet having sufficient flexibility and excellent adhesiveness to a sheet of metal foil, for example.

In the formula (3), the alkyl group represented by $R^A$ and having 8 to 22 carbon atoms may be, for example, a straight-chain or branched-chain alkyl group. More specific examples of such an alkyl group include an octyl group, a nonyl group, a decyl group, a dodecyl group, a tetradecyl group, a hexadecyl group, an octadecyl group, an cicosyl group, and a docosyl group. Examples of an alkenyl group having 8 to 22 carbon atoms include a decenyl group.

Examples of the allyl compound (d1) according to this embodiment include at least one selected from the group consisting of 5-octyl-1,3-diallyl isocyanurate, 5-dodecyl-1,3-diallyl isocyanurate, 5-tetradecyl-1,3-diallyl isocyanurate, 5-hexadecyl-1,3-diallyl isocyanurate, 5-octadecyl-1,3-diallyl isocyanurate, 5-cicosyl-1,3-diallyl isocyanurate, 5-docosyl-1,3-diallyl isocyanurate, and 5-decenyl-1,3-diallyl isocyanurate. The allyl compound (d1) according to this embodiment may be synthesized by, for example, stirring up diallyl isocyanurate and an alkyl halide in an aprotic polar solvent such as N,N'-dimethylformamide (DMF) in the presence of a basic substance while heating the diallyl isocyanurate and the alkyl halide and thereby allowing the diallyl isocyanurate and the alkyl halide to react with each other. Examples of the basic substance include sodium hydroxide, potassium carbonate, and triethylamine. The reaction temperature is preferably equal to or higher than 60° C. and equal to or lower than 150° C., for example.

The curing agent (D) according to this embodiment may include, besides the allyl compound (d1), at least one selected from the group consisting of, for example, styrene, styrene derivatives, compounds having an acryloyl group in their molecule, compounds having a methacryloyl group in their molecule, compounds having a vinyl group in their molecule, compounds having an acenaphthylene structure in their molecule, and compounds having a maleimide group in their molecule.

Examples of the compounds having a maleimide group in their molecule include a monofunctional maleimide compound having a single maleimide group in its molecule, a polyfunctional maleimide compound having two or more maleimide groups in its molecule, and a modified maleimide compound. Examples of the modified maleimide compound include a modified maleimide compound in which part of the molecule is modified with an amine compound, a modified maleimide compound in which part of the molecule is modified with a silicone compound, and a modified maleimide compound in which part of the molecule is modified with either an amine compound or a silicone compound.

(Silane Coupling Agent Having Triazine Ring)

The resin composition according to this embodiment may contain, for example, a silane coupling agent (E) having a triazine ring. Adding the silane coupling agent (E) having the triazine ring to the resin composition according to this embodiment allows the resin composition according to this embodiment to provide a cured product having low dielectric properties and yet having excellent adhesiveness to a sheet of metal foil, for example.

Examples of the silane coupling agent (E) with a triazine ring include triazine derivatives each having, at one terminal thereof, either a trimethoxysilyl group or triethoxysilyl group.

<Other Components>

The resin composition according to this embodiment may further contain, as needed, for example, additional components other than the polyphenylene ether compound (A), the styrene block copolymer (B), the polybutadiene compound (C), the curing agent (D), and the silane coupling agent (E) having the triazine ring as long as the advantage of the present disclosure is not impaired. Examples of the other components that may be contained in the resin composition according to this embodiment include, without limitation, additives such as a flame retardant, an initiator, a curing accelerator, an antifoaming agent, an antioxidant, a polymerization inhibitor, a polymerization retarder, a dispersant, a leveling agent, a heat stabilizer, an antistatic agent, a UV absorber, a dye, a pigment, a lubricant, and a filler.

Optionally, the resin composition according to this embodiment may contain not only the polyphenylene ether compound (A) but also a thermosetting resin other than the polyphenylene ether compound (A). Such a thermosetting resin includes at least one selected from the group consisting of, for example, an epoxy resin, an unsaturated polyester resin, and a thermosetting polyimide resin.

The resin composition according to this embodiment may contain a flame retardant as described above. Adding the flame retardant to the resin composition according to this embodiment allows a cured product of the resin composition to have good flame retardance. Specific examples of flame retardants for use in the field using halogen-based flame retardants such as brominated flame retardants include, for example, ethylenedipentabromobenzene, ethylenebistetrabromoimide, decabromodiphenyl oxide, and tetradecabromodiphenoxybenzene, all of which have a melting point equal to or higher than 300° C. Specific examples of flame retardants in fields requiring halogen-free include phosphate ester flame retardants, phosphazene flame retardants, bisdiphenylphosphine oxide flame retardants, and phosphinate flame retardants.

The resin composition according to this embodiment may contain an initiator (reaction initiator) as described above. The reaction initiator is preferably able to accelerate the curing reaction between the polyphenylene ether compound (A) and the curing agent (D). Specific examples of the reaction initiator include oxidants such as a, a'-bis(t-butylperoxy-m-isopropyl)benzene, 2,5-dimethyl-2,5-di(t-butylperoxy)-3-hexin, benzoyl peroxide, 3,3',5,5'-tetramethyl-1,4-diphenoquinone, Chloranil, 2,4,6-tri-t-butylphenoxyl, t-butylperoxy isopropyl monocarbonate, and azobisisobutyronitrile. Among other things, a, a'-bis(t-butylperoxy-m-isopropyl)benzene is preferably used as the reaction initiator. If necessary, the reaction initiator may contain, for example, a carboxylic acid metal salt in addition to the oxidant. That is to say, the reaction initiator and the carboxylic acid metal salt are preferably used in combination. This makes it easier to accelerate the curing reaction of the resin composition according to this embodiment. Note that the reaction initiator may be used by itself. Alternatively, two or more types of reaction initiators may be used in combination.

The resin composition according to this embodiment may contain a curing accelerator, as described above. The curing accelerator preferably accelerates the curing reaction of the resin composition according to this embodiment. Specific examples of the curing accelerators include imidazoles and derivatives thereof, organic phosphorus compounds, amines such as secondary amines and tertiary amines, quaternary ammonium salts, organic boron compounds, and metal soaps.

The imidazoles and derivatives thereof include, for example, at least one selected from the group consisting of, for example, 2-ethyl-4-methylimidazole, 2-methylimidazole, 2-phenyl-4-methylimidazole, 2-phenylimidazole, and 1-benzyl-2-methylimidazole.

The organic phosphorus compounds include at least one selected from the group consisting of, for example, triphenylphosphine, diphenylphosphine, phenylphosphine, tributylphosphine, and trimethylphosphine.

The amines include at least one selected from the group consisting of, for example, dimethylbenzylamine, triethylenediamine, triethanolamine, and 1,8-diazabicyclo [5,4,0]-7-undecene (DBU).

The quaternary ammonium salt may be, for example, tetrabutylammonium bromide.

The organic boron compounds include at least one selected from the group consisting of, for example, tetraphenylboron salts such as 2-ethyl-4-methylimidazole tetraphenylborate, and tetrasubstituted phosphonium tetrasubstituted borates such as tetraphenylphosphonium ethyl triphenyl borate.

The metal soap refers to a fatty acid metal salt, for example, and may be a straight-chain fatty acid metal salt or a cyclic fatty acid metal salt, whichever is appropriate. Specific examples of the metal soaps include straight-chain aliphatic metal salts and cyclic aliphatic metal salts having 6 to 10 carbon atoms. More specifically, the metal soaps include at least one selected from the group consisting of, for example, straight-chain fatty acids such as stearic acid, lauric acid, ricinoleic acid, and octylic acid, cyclic fatty acids such as naphthenic acid, and aliphatic metal salts including a metal such as lithium, magnesium, calcium, barium, copper, and zinc. The curing accelerator may be used by itself. Alternatively, two or more types of curing accelerators may be used in combination.

The resin composition according to this embodiment may contain fillers such as an inorganic filler as described above. The filler is preferably able to improve the heat resistance and flame retardance of the cured product of the resin composition. The filler includes at least one selected from the group consisting of, for example, silica such as spherical silica, metal oxides such as alumina, titanium oxide, and mica, metal hydroxides such as aluminum hydroxide and magnesium hydroxide, talc, aluminum borate, barium sulfate, and calcium carbonate. Among other things, the filler is preferably silica such as spherical silica, mica, or talc, or is more preferably spherical silica.

Only one type of filler may be used by itself. Alternatively, two or more types of fillers may be used in combination. Optionally, the filler to be used may have its surface subjected to surface treatment using a silane coupling agent, for example.

(Content)

In the resin composition according to this embodiment, the percentage of the polyphenylene ether compound (A) to the resin components (organic components) is preferably equal to or greater than 10% by mass and more preferably equal to or greater than 20% by mass. Also, in the resin composition, the percentage of the polyphenylene ether compound (A) to the resin components (organic components) is preferably equal to or less than 95% by mass and more preferably equal to or less than 90% by mass.

As used herein, the "resin components" of the resin composition according to this embodiment refer to, for example, organic components including the polyphenylene ether compound (A), the styrene block copolymer (B), the polybutadiene compound (C), and the curing agent (D).

The percentage of the styrene block copolymer (B) to the total of the polyphenylene ether compound (A), the styrene block copolymer (B), and the allyl compound (d1) is preferably equal to or greater than 5% by mass and more preferably equal to or greater than 10% by mass. Also, the percentage of the styrene block copolymer (B) to the total of the polyphenylene ether compound (A), the styrene block copolymer (B), and the allyl compound (d1) is preferably equal to or less than 50% by mass and more preferably equal to or less than 40% by mass.

The percentage of the polybutadiene compound (C) to the total of the polyphenylene ether compound (A), the polybutadiene compound (C), and the allyl compound (d1) is preferably equal to or greater than 5% by mass and more preferably equal to or greater than 6% by mass. Also, the percentage of the polybutadiene compound (C) to the total of the polyphenylene ether compound (A), the polybutadiene compound (C), and the allyl compound (d1) is preferably equal to or less than 40% by mass and more preferably equal to or less than 25% by mass.

The percentage of the curing agent (D) to the resin components of the resin composition according to this embodiment is preferably equal to or greater than 5% by mass and more preferably equal to or greater than 10% by mass. Also, the percentage of the curing agent (D) to the resin components of the resin composition is preferably equal to or less than 60% by mass and more preferably equal to or less than 50% by mass.

The percentage of the silane coupling agent (E) having the triazine ring to the filler is preferably equal to or greater than 0.1% by mass and more preferably equal to or greater than 1% by mass. Also, the percentage of the silane coupling agent (E) having the triazine ring to the filler is preferably equal to or less than 7% by mass and more preferably equal to or less than 5% by mass.

The ratio by mass of the styrene block copolymer (B) to the total of the polyphenylene ether compound (A) and the allyl compound (d1) preferably falls within the range from 50:50 to 95:5. Setting the ratio by mass of the styrene block copolymer (B) to the total of the polyphenylene ether compound (A) and the allyl compound (d1) at a value falling within this numerical value range allows the resin composition according to this embodiment to provide a cured product having low dielectric properties and yet having sufficient flexibility and excellent adhesiveness to a sheet of metal foil, for example. The ratio by mass of the styrene block copolymer (B) to the total of the polyphenylene ether compound (A) and the allyl compound (d1) more preferably falls within the range from 50:50 to 90:10 and even more preferably falls within the range from 50:50 to 85:15.

The content of the polybutadiene compound (C) with respect to 100 parts by mass as the total of the polyphenylene ether compound (A) and the allyl compound (d1) is preferably equal to or greater than 5 parts by mass and equal to or less than 40 parts by mass. This allows the resin composition according to this embodiment to provide a cured product having low dielectric properties and yet having sufficient flexibility and excellent adhesiveness to a sheet of metal foil, for example. Meanwhile, the content of the polybutadiene compound (C) with respect to the total of the polyphenylene ether compound (A) and the allyl compound (d1) is more preferably equal to or greater than 6 parts by mass. The content of the polybutadiene compound (C) with respect to the total of the polyphenylene ether compound (A) and the allyl compound (d1) is more preferably equal to or less than 35 parts by mass.

If the curing agent (D) according to this embodiment contains a compound having a maleimide group in its molecule, then the percentage of such a compound having the maleimide group in its molecule to the resin composition according to this embodiment is preferably less than 10% by mass. Setting the percentage of such a compound having the maleimide group in its molecule to the resin composition according to this embodiment at a value less than 10% by mass allows the resin composition according to this embodiment to provide a cured product having low dielectric properties and yet having sufficient flexibility and excellent adhesiveness to a sheet of metal foil, for example.

If the resin composition according to this embodiment contains a filler, then the percentage of the filler to the resin composition is preferably equal to or greater than 50% by mass and equal to or less than 300% by mass, more preferably equal to or greater than 70% by mass and equal to or less than 300% by mass, and even more preferably equal to or greater than 100% by mass and equal to or less than 300% by mass.

<Method for manufacturing resin composition>

Next, a method for manufacturing the resin composition according to this embodiment will now be described.

An exemplary method for manufacturing the resin composition according to this embodiment may include, for example, mixing the polyphenylene ether compound (A), the styrene block copolymer (B), the polybutadiene compound (C), and the curing agent (D) such that these components (A)-(D) respectively have predetermined contents.

Optionally, the resin composition according to this embodiment may contain an organic solvent. That is to say, the resin composition according to this embodiment is preferably used as a resin composition in the form of varnish containing the organic solvent. Note that the resin composition in the form of varnish containing the organic solvent has not only the respective components of the resin composition according to this embodiment but also the organic solvent as an additional component as well.

Such a resin composition in the form of varnish may be manufactured in the following manner. First, respective components which may be dissolved in an organic solvent are introduced into the organic solvent and dissolved while being stirred up, thereby preparing a mixture. Optionally, the mixture may also be prepared to be stirred up while being heated. Subsequently, other components which cannot be dissolved in the organic solvent are introduced into the mixture and continuously dispersed using a ball mill, a beads mill, a planetary mixer, or a roll mill, for example, until the mixture has a predetermined dispersion state, thereby manufacturing a resin composition in the form of varnish. Note that the organic solvent used in this case is preferably a solvent which may dissolve the polyphenylene ether compound (A), the styrene block copolymer (B), the polybutadiene compound (C), the curing agent (D), and other components and does not impede the curing reaction of the resin composition. Specific examples of the organic solvent include toluene and methyl ethyl ketone (MEK).

Exemplary Applications of Resin Composition

Next, exemplary applications of the resin composition according to this embodiment will now be described.

The resin composition according to this embodiment may be used to make a resin layer included in a film with resin, a resin layer included a sheet of metal foil with resin, an insulating layer included in a metal-clad laminate, and an insulating layer included in a printed wiring board. More specifically, the resin layer included in the film with resin includes at least one of an uncured product of the resin composition according to this embodiment or a semi-cured product of the resin composition. The resin layer included in the sheet of metal foil with resin includes at least one of an uncured product of the resin composition according to this embodiment or a semi-cured product of the resin composition. The insulating layer included in the metal-clad laminate includes a cured product of the resin composition according to this embodiment. The insulating layer included in the printed wiring board includes a cured product of the resin composition according to this embodiment.

Note that the "semi-cured product" as used herein refers to a resin composition which has been cured incompletely to such a degree that allows the resin composition to be further cured. That is to say, the semi-cured product herein refers to a resin composition in a semi-cured state, i.e., a resin composition which has made a transition to so-called "Stage B." For example, as the resin composition according to this embodiment is heated, its viscosity gradually decreases for a while since the beginning of heating. After that, however, the solvent included in the resin composition vaporizes and the resin starts to be cured to cause a gradual increase in viscosity. As can be seen, the "semi-cured state" herein refers to an intermediate state between a point in time when the viscosity starts to increase and a point in time when the resin composition is fully cured. In addition, in this embodiment, even a situation where the unsaturated bond in the polyphenylene ether compound (A) and curing agent (D) included in the resin composition according to this embodiment does not react and the curing reaction has not started yet but vaporization of the solvent from the resin composition simply causes a decrease in the flowability of the resin composition is also supposed to be a semi-cured state. In such a situation, if the resin composition in the form of varnish is used to make the resin layer 12 of the film 11 with resin (to be described later) or the resin layer 22 of the sheet of metal foil 21 with resin (to be described later), the content of the solvent included in the resin layer 12, 22 is preferably equal to or less than 1.5% by mass and more preferably equal to or less than 1% by mass.

The semi-cured product of the resin composition according to this embodiment preferably has a minimum bending radius equal to or shorter than 2 mm. This allows the resin composition according to this embodiment to provide a cured product having sufficient flexibility and excellent adhesiveness to a sheet of metal foil, for example. Note that the "minimum bending radius" of the semi-cured product as used herein refers to, for example, an R value of a folding clamp obtained by subjecting a semi-cured product made of the resin composition according to this embodiment to an MIT test compliant with the JIS P8115 standard with the semi-cured product folded once or more under a measuring condition including a load of 0.5 kgf, a bending angle of 135 degrees, and a test rate of 175 cpm. Also, the test piece for use in the measurement may be obtained by cutting off a test piece on which a circuit pattern has been formed to a width of 15 mm and a length of 130 mm. Furthermore, an MIT test device (model number: MIT-DA manufactured by Toyo Seiki Seisaku-Sho, Ltd.) may be used, for example, to conduct the minimum bending test.

Also, the semi-cured product of the resin composition according to this embodiment more preferably has a minimum bending radius equal to or shorter than 1 mm and even more preferably equal to or shorter than 0.5 mm.

The cured product of the resin composition according to this embodiment preferably has a minimum bending radius equal to or shorter than 2 mm. This also allows the resin composition according to this embodiment to provide a cured product having sufficient flexibility and excellent adhesiveness to a sheet of metal foil, for example. The minimum bending radius of the cured product of the resin composition may be measured by, for example, the same method as the minimum bending radius of the semi-cured product according to this embodiment.

Also, the cured product of the resin composition according to this embodiment more preferably has a minimum bending radius equal to or shorter than 1 mm and even more preferably has a minimum bending radius equal to or shorter than 0.5 mm.

(Film with Resin)

Next, a film with resin according to this embodiment will be described.

FIG. 1 is a schematic cross-sectional view illustrating an exemplary film 11 with resin according to this embodiment.

As shown in FIG. 1, the film 11 with resin according to this embodiment includes: a resin layer 12 containing at least one of the resin composition according to this embodiment or a semi-cured product of the resin composition; and a supporting film 13. That is to say, the film 11 with resin includes: the resin layer 12 containing at least one of an uncured product of the resin composition according to this embodiment or a semi-cured product of the resin composition; and the supporting film 13 laid on top of the resin layer 12.

Optionally, the film 11 with resin may include another layer interposed between the resin layer 12 and the supporting film 13, for example.

Furthermore, the resin layer 12 may contain a semi-cured product of the resin composition according to this embodiment or the resin composition that has not been cured yet, whichever is appropriate, as described above. That is to say, the film 11 with resin may include the resin layer 12 containing the semi-cured product of the resin composition (i.e., Stage B resin composition) and the supporting film 13. Alternatively, the film 11 with resin may also include the resin layer 12 containing the resin composition that has not been cured yet and the supporting film 13.

The resin layer 12 may further include a fibrous base member. That is to say, a prepreg including the resin composition according to this embodiment and the fibrous base member may be used as the resin layer 12 of the film 11 with resin according to this embodiment. If the fibrous base member is used in the resin layer 12, the fibrous base member includes at least one selected from the group consisting of, for example, glass cloth, aramid cloth, polyester cloth, glass nonwoven fabric, aramid nonwoven fabric, polyester nonwoven fabric, pulp paper, and linter paper. Among other things, glass cloth is preferably used as the fibrous base member. Note that using the glass cloth allows the resin layer 12 to have excellent mechanical strength. The glass cloth is more preferably subjected to flattening treatment. That is to say, the fibrous base member is more preferably glass cloth subjected to flattening treatment. According to a specific example of flattening treatment, the glass cloth may be, for example, continuously pressed by a press roller with appropriate pressure to compress the yarn into a flat shape. Note that a fibrous base member used generally may have a thickness equal to or greater than 0.01 mm and equal to or less than 0.3 mm, for example.

Meanwhile, the supporting film 13 includes at least one type of film with electrical insulation properties selected from the group consisting of, for example, a polyester film, a polyethylene terephthalate (PET) film, a polyimide film, a polyparabanic acid film, a polyetheretherketone film, a polyphenylene sulfide film, a polyamide film, a polycarbonate film, and a polyarylate film.

Optionally, the film 11 with resin may further include a cover film, for example. Providing the cover film may prevent foreign particles from entering the film 11 with resin. Specific examples of the cover film include a polyolefin film, a polyester film, and a polymethylpentene film.

The supporting film 13 and the cover film may be subjected to surface treatment such as matte treatment, corona treatment, release treatment, and roughening treatment.

Next, a method for manufacturing the film 11 with resin will be described.

An exemplary method for manufacturing the film 11 with resin may include, for example, mixing the resin composition according to this embodiment and a solvent together by the above-described method to prepare a resin composition in the form of varnish and applying the resin composition in the form of varnish onto the supporting film 13 and heating the resin composition to form a resin layer 12 laid on top of the supporting film 13.

Examples of techniques for applying the resin composition in the form of varnish onto the supporting film 13 include a technique using a bar coater.

Subsequently, after the resin composition in the form of varnish has been applied onto the supporting film 13, the resin composition in the form of varnish thus applied is heated to vaporize the organic solvent from the resin composition in the form of varnish. In this case, the resin composition in the form of varnish thus applied is preferably heated to a temperature equal to or higher than 80° C. and equal to or lower than 180° C., for example. In addition, the resin composition in the form of varnish thus applied is preferably heated for a duration equal to or longer than 1 minute and equal to or shorter than 10 minutes. The film 11 with resin according to this embodiment may be manufactured by forming the resin composition according to this embodiment as an uncured or semi-cured resin layer 12 on the supporting film 13 in this manner.

The resin composition according to this embodiment may provide, as described above, a cured product having low dielectric properties and yet having sufficient flexibility and excellent adhesiveness to a sheet of metal foil, for example. Thus, the film 11 with resin includes a resin layer 12 that serves as an insulating layer having low dielectric properties and yet having sufficient flexibility and excellent adhesiveness to a sheet of metal foil, for example. This film 11 with resin is suitably used to manufacture a printed wiring board including an insulating layer having low dielectric properties and yet having sufficient flexibility and excellent adhesiveness to a sheet of metal foil, for example. A multilayer printed wiring board may be manufactured by, for example, either stacking the film 11 with resin on a printed wiring board and then peeling off the supporting film 13 or stacking the film 11 with resin on the printed wiring board after having peeled off the supporting film 13.

Note that this is only an exemplary method for manufacturing the film 11 with resin including the resin layer 12 made of the resin composition according to this embodiment and the supporting film 13 laid on top of the resin layer 12 and should not be construed as limiting. That is to say, the film 11 with resin may be manufactured by any other appropriate method using the resin composition according to this embodiment. Furthermore, the film 11 with resin according to this embodiment does not have to be used only for the purpose of manufacturing a printed wiring board. In other words, the film 11 with resin according to this embodiment may also be used for various other purposes.

(Sheet of Metal Foil with Resin)

Next, a sheet of metal foil with resin according to this embodiment will be described.

Figure 2:
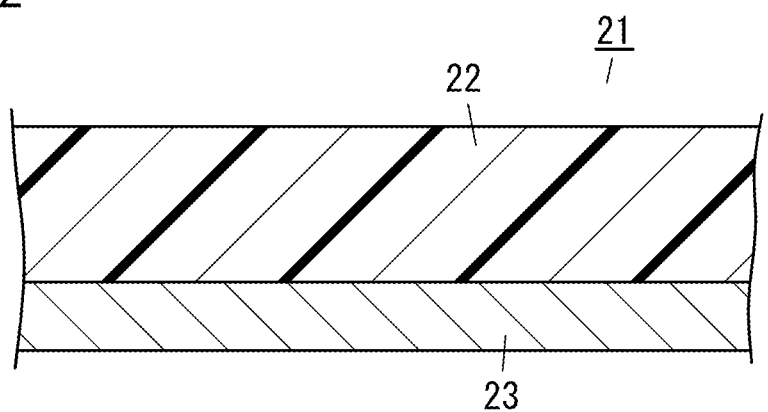
FIG. 2 is a schematic cross-sectional view illustrating an exemplary sheet of metal foil with resin according to the exemplary embodiment of the present disclosure.

FIG. 2 is a schematic cross-sectional view illustrating an exemplary sheet of metal foil 21 with resin according to this embodiment.

As shown in FIG. 2, the sheet of metal foil 21 with resin according to this embodiment includes: a resin layer 22 containing at least one of the resin composition according to this embodiment or a semi-cured product of the resin composition; and a sheet of metal foil 23 laid on top of the resin layer 22. That is to say, the sheet of metal foil 21 with resin according to this embodiment includes: the resin layer 22 containing at least one of an uncured product of the resin composition according to this embodiment or a semi-cured product of the resin composition; and the sheet of metal foil 23 laid on top of the resin layer 22. Optionally, the sheet of metal foil 21 with resin may include another layer interposed between the resin layer 22 and the sheet of metal foil 23.

The resin layer 22 may contain a semi-cured product of the resin composition according to this embodiment or the resin composition that has not been cured yet, whichever is appropriate, as described above. That is to say, the sheet of metal foil 21 with resin may include the resin layer 22 containing the semi-cured product of the resin composition (i.e., Stage B resin composition) and the sheet of metal foil 23. Alternatively, the sheet of metal foil 21 with resin may also include the resin layer 22 containing the resin composition that has not been cured yet and the sheet of metal foil 23.

The resin layer 22 may include a fibrous base member, for example. The fibrous base member may be, for example, the same as the fibrous base member used to manufacture the film 11 with resin described above.

Furthermore, any appropriate sheet of metal foil may be used as the sheet of metal foil 23. Specific examples of the sheet of metal foil 23 include a sheet of copper foil and a sheet of aluminum foil.

Optionally, the sheet of metal foil 21 with resin may further include a cover film, for example. The cover film may be, for example, the same as the cover film used to manufacture the film 11 with resin described above.

Next, a method for manufacturing the sheet of metal foil 21 with resin according to this embodiment will be described.

An exemplary method for manufacturing the sheet of metal foil 21 with resin may include, for example, mixing the resin composition according to this embodiment and a solvent together by the above-described method to prepare a resin composition in the form of varnish and applying the resin composition in the form of varnish onto the sheet of metal foil 23 and heating the resin composition to form a resin layer 22 laid on top of the sheet of metal foil 23.

Examples of techniques for applying the resin composition in the form of varnish onto the sheet of metal foil 23 include a technique using a bar coater.

Subsequently, after the resin composition in the form of varnish has been applied onto the sheet of metal foil 23, the resin composition in the form of varnish thus applied is heated to vaporize the organic solvent from the resin composition in the form of varnish. In this case, the resin composition in the form of varnish thus applied is preferably heated to a temperature equal to or higher than 80° C. and equal to or lower than 180° C., for example. In addition, the resin composition in the form of varnish thus applied is preferably heated for a duration equal to or longer than 1 minute and equal to or shorter than 10 minutes. The sheet of metal foil 21 with resin according to this embodiment may be manufactured in this manner by forming, on the sheet of metal foil 23, a resin layer 22 including an uncured or semi-cured resin composition.

The resin composition according to this embodiment may provide a cured product having low dielectric properties and yet having sufficient flexibility and excellent adhesiveness to a sheet of metal foil, for example. Thus, the sheet of metal foil 21 with resin includes a resin layer 12 that serves as an insulating layer having low dielectric properties and yet having sufficient flexibility and excellent adhesiveness to a sheet of metal foil, for example. This sheet of metal foil 21 with resin is suitably used to manufacture a printed wiring board including an insulating layer having low dielectric properties and yet having sufficient flexibility and excellent adhesiveness to a sheet of metal foil, for example.

Note that this is only an exemplary method for manufacturing the sheet of metal foil 21 with resin including the resin layer 22 made of the resin composition according to this embodiment and the sheet of metal foil 23 laid on top of the resin layer 22 and should not be construed as limiting. That is to say, the sheet of metal foil 21 with resin may be manufactured by any other appropriate method using the resin composition according to this embodiment. Furthermore, the sheet of metal foil 21 with resin according to this embodiment does not have to be used only for the purpose of manufacturing a printed wiring board. In other words, the sheet of metal foil 21 with resin according to this embodiment may also be used for various other purposes.

(Metal-clad laminate)

Next, a metal-clad laminate that uses the resin composition according to this embodiment will be described.

FIG. 3 is a schematic cross-sectional view illustrating an exemplary metal-clad laminate 31 according to this embodiment.

As shown in FIG. 3, the metal-clad laminate 31 includes: an insulating layer 32 made of the resin composition according to this embodiment; and at least one sheet of metal foil 33 laid on top of the insulating layer 32. That is to say, the metal-clad laminate 31 includes the insulating layer 32 containing a cured product of the resin composition according to this embodiment and the sheet of metal foil 33 laid on top of the insulating layer 32.

This insulating layer 32 is preferably a cured product of the resin composition according to this embodiment as described above. Alternatively, the insulating layer 32 may also be a cured product of a prepreg including the resin composition according to this embodiment and a fibrous base member, for example. In the latter case, the fibrous base member may be the same as the fibrous base member used to make the film 11 with resin and the sheet of metal foil 21 with resin.

The thickness of the sheet of metal foil 33 may be set at any appropriate value according to the intended use. Specific examples of the sheet of metal foil 33 include a sheet of copper foil and a sheet of aluminum foil.

Next, a method for manufacturing the metal-clad laminate 31 according to this embodiment will be described.

An exemplary method for manufacturing the metal-clad laminate 31 may include, for example, making the insulating layer 32 out of a cured product of the resin composition according to this embodiment and then stacking the sheet of metal foil 33 on the insulating layer 32 and heating the assembly under pressure. More specifically, the exemplary method for manufacturing the metal-clad laminate 31 includes stacking the sheet of metal foil 33 such as a sheet of copper foil on the upper or lower surface or both of the upper and lower surfaces of the insulating layer 32 containing a cured product of the resin composition according to this embodiment and subjecting the sheet of metal foil(s) 33 and the insulating layer 32 to a molding process under heat and pressure to stack and integrate these members together. In this manner, a metal-clad laminate 31, in which the sheet of metal foil 33 is attached to either surface or both surfaces of the insulating layer 32, may be manufactured.

Alternatively, the insulating layer 32 may also be formed out of the above-described film 11 with resin. More specifically, the insulating layer 32 of the metal-clad laminate 31 according to this embodiment may be formed by heating and curing the resin layer 12 of the film 11 with resin.

Still alternatively, the insulating layer 32 may also be formed using the above-described sheet of metal foil 21 with resin. More specifically, the insulating layer 32 of the metal-clad laminate 31 according to this embodiment may also be formed by heating and curing the resin layer 22 of the sheet of metal foil 21 with resin. In that case, the sheet of metal foil 23 of the sheet of metal foil 21 with resin serves as the sheet of metal foil 33 of the metal-clad laminate 31.

When the metal-clad laminate 31 is manufactured, the heating and pressing conditions are preferably set appropriately according to, for example, the thickness of the metal-clad laminate 31 to manufacture and the type of the composition of the insulating layer 32.

Specifically, the heating temperature when the metal-clad laminate 31 is manufactured is preferably equal to or higher than 170° C. and equal to or lower than 230° C. Also, the pressure when the metal-clad laminate 31 is manufactured is preferably equal to or higher than 1.5 MPa and equal to or lower than 5.0 MPa. Furthermore, the heating and pressing duration when the metal-clad laminate 31 is manufactured is preferably equal to or longer than 60 minutes and equal to or shorter than 150 minutes.

When the metal-clad laminate 31 is manufactured, the thickness of the sheet of metal foil 33 may be set at an appropriate value according to the intended use. For example, a sheet of metal foil with a thickness equal to or greater than 0.2 µm and equal to or less than 70 µm may be used as the sheet of metal foil 33. If the sheet of metal foil has a thickness equal to or less than 10 µm, for example, then the sheet of metal foil may be a sheet of copper foil with a carrier, including a peelable layer and a carrier, to improve the handleability. The sheet of metal foil 33 preferably has a thickness equal to or greater than 0.2 µm and equal to or less than 35 µm and more preferably has a thickness equal to or greater than 1 µm and equal to or less than 18 µm. Even if the sheet of metal foil 33 has such a small thickness, using the resin composition according to this embodiment to manufacture the metal-clad laminate 31 also allows the insulating layer 32 and the sheet of metal foil 33 to adhere sufficiently closely to each other in the metal-clad laminate 31. In the metal-clad laminate 31 according to this embodiment, a peel strength between the insulating layer 32 as a cured product of the resin composition and the sheet of metal foil 33 is preferably equal to or greater than 0.50 N/mm, more preferably equal to or greater than 0.55 N/mm, and even more preferably equal to or greater than 0.60 N/mm.

The resin composition according to this embodiment may provide a cured product having low dielectric properties and yet having sufficient flexibility and excellent adhesiveness to a sheet of metal foil, for example. Thus, the metal-clad laminate 31 including the insulating layer 32 containing the cured product of this resin composition includes the insulating layer 32 having low dielectric properties and yet having sufficient flexibility and excellent adhesiveness to a sheet of metal foil, for example. Such a metal-clad laminate 31 is suitably used as, for example, a flexible coper clad laminate (FCCL). Using this metal-clad laminate 31 to manufacture a printed wiring board allows the printed wiring board manufactured to include an insulating layer having low dielectric properties and yet having sufficient flexibility and excellent adhesiveness to a sheet of metal foil, for example.

Note that the metal-clad laminate 31 according to this embodiment does not have to be implemented as a flexible copper clad laminate. That is to say, the metal-clad laminate 31 according to this embodiment may be used for various other purposes as well. Also, this is only an exemplary method for manufacturing the metal-clad laminate 31 including the insulating layer 32 made of the resin composition according to this embodiment and the sheet of metal foil 33 laid on top of the insulating layer 32 and should not be construed as limiting. That is to say, the metal-clad laminate 31 may be manufactured by any other appropriate method using the resin composition according to this embodiment.

(Printed Wiring Board)

Next, a printed wiring board according to this embodiment will be described.

Figure 4A:
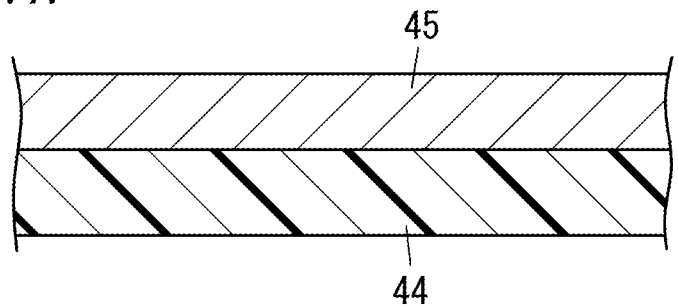
FIGS. 4A-4D are schematic cross-sectional views illustrating an exemplary method for manufacturing a printed wiring board according to the exemplary embodiment of the present disclosure.
Figure 4B:
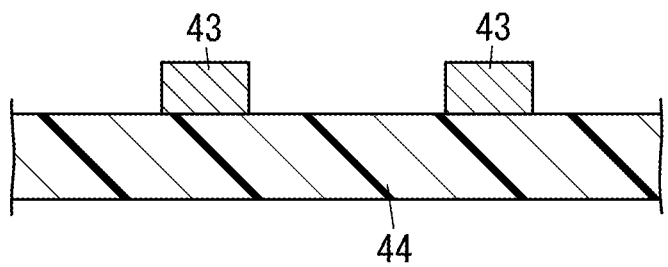
Figure 4C:
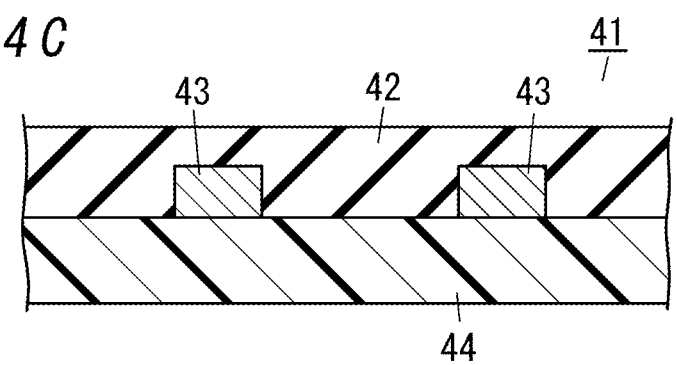
Figure 4D:
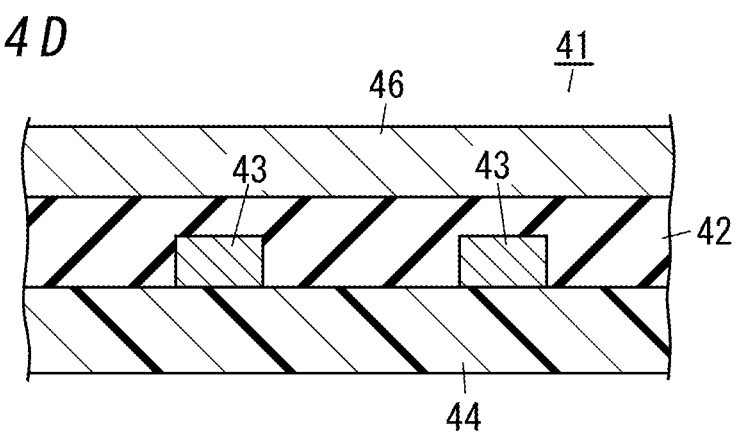

FIGS. 4C and 4D are schematic cross-sectional views illustrating how to manufacture a printed wiring board 41 according to this embodiment.

As shown in FIG. 4C, the printed wiring board 41 according to this embodiment includes an insulating layer 42 made of the resin composition according to this embodiment and wiring 43 covered with the insulating layer 42. That is to say, in the printed wiring board 41 according to this embodiment, the insulating layer 42 containing a cured product of the resin composition according to this embodiment is laid on top of the wiring 43 that has been formed by partially removing a sheet of metal foil 45 laid on top of a base member layer 44. Optionally, in the printed wiring board 41 according to this embodiment, another sheet of metal foil 46 may be further stacked over the insulating layer 42 as shown in FIG. 4D.

A specific exemplary base member layer 44 may be made of, for example, either polyimide or a liquid crystal polymer (hereinafter abbreviated as "LCP"). Among other things, the base member layer 44 is preferably made of an LCP. Also, in the printed wiring board according to this embodiment, the peel strength between the insulating layer 42 as a cured product of the resin composition and the LCP is preferably equal to or greater than 0.25 N/mm, more preferably equal to or greater than 0.30 N/mm, and even more preferably equal to or greater than 0.40 N/mm.

Optionally, the resin composition according to this embodiment may also be used for the base member layer 44 of the printed wiring board 41. In that case, the base member layer 44 of the printed wiring board 41 is preferably a cured product of a prepreg including the resin composition according to this embodiment and a fibrous base member.

Also, the sheet of metal foil 45 may be the same as the one used to manufacture the metal-clad laminate 31.

Next, a method for manufacturing the printed wiring board 41 according to this embodiment will be described.

The printed wiring board 41 according to this embodiment may be manufactured in the following manner, for example. First, as shown in FIG. 4A, the sheet of metal foil 45 is stacked on the base member layer 44.

Next, as shown in FIG. 4B, the sheet of metal foil 45 is partially removed, thereby forming, on the surface of the base member layer 44, wiring 43 to be a circuit of the printed wiring board. Examples of a method for forming the circuit include a circuit forming method by either a semi-additive process (SAP) or a modified semi-additive process (MSAP).

Subsequently, as shown in FIG. 4C, the insulating layer 42 made of the resin composition according to this embodiment is formed over the wiring 43 thus formed. An exemplary method for forming the insulating layer 42 may include, for example, mixing the resin composition according to this embodiment and a solvent together to prepare a resin composition in the form of varnish, applying the resin composition in the form of varnish onto the wiring 43, and curing the resin composition in the form of varnish thus applied.

In this manner, the printed wiring board 41 according to this embodiment may be manufactured. Optionally, as shown in FIG. 4D, another sheet of metal foil 46 may be further stacked on the insulating layer 42 thus formed as described above. A multilayer structure may be formed by repeatedly performing this series of process steps including partially removing the sheet of metal foil 46 to form another wiring and then stacking another insulating layer over the wiring thus formed.

The printed wiring board 41 according to this embodiment includes the insulating layer 42 containing a cured product having low dielectric properties and yet having sufficient flexibility and excellent adhesiveness to a sheet of metal foil, for example. That is to say, the printed wiring board 41 according to this embodiment includes the insulating layer 42 having low dielectric properties and yet having sufficient flexibility and excellent adhesiveness to a sheet of metal foil, for example. Such a printed wiring board 41 is suitably used, for example, in flexible printed circuits (FPCs).

Note that this is only an exemplary method for manufacturing the printed wiring board 41 according to this embodiment and should not be construed as limiting. That is to say, the printed wiring board 41 may also be manufactured by any other appropriate method using the resin composition according to this embodiment.

It should also be noted that the printed wiring board 41 according to this embodiment does not have to be used in flexible printed circuits. That is to say, the printed wiring board 41 according to this embodiment may find various other applications as well.

<Recapitulation>

As can be seen from the foregoing description of embodiments, a resin composition according to a first aspect of the present disclosure contains a polyphenylene ether compound (A), a styrene block copolymer (B), a polybutadiene compound (C), and a curing agent (D). The polyphenylene ether compound (A) has, in a molecule thereof, at least one of a group expressed by the following formula (1) or a group expressed by the following formula (2):

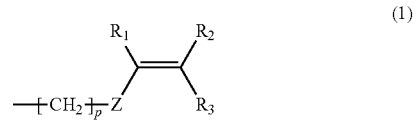

(1)

In the formula (1), p indicates an integer falling within a range from 0 to 10, Z indicates an arylene group, and $R_1$ to $R_3$ each independently indicate either a hydrogen atom or an alkyl group.

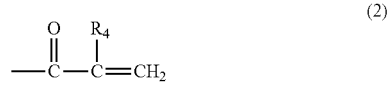

(2)

In the formula (2), $R_4$ indicates either a hydrogen atom or an alkyl group. The polybutadiene compound (C) has an epoxy group in a molecule thereof. The curing agent (D) contains an allyl compound (d1) expressed by the following formula (3):

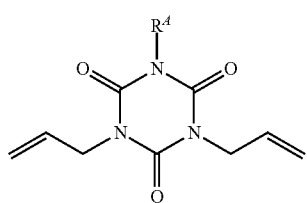

(3)

In the formula (3), $R^A$ indicates either an alkyl group or an alkenyl group, each having 8 to 22 carbon atoms.

The resin composition according to the first aspect may provide a cured product having low dielectric properties and yet having sufficient flexibility and excellent adhesiveness to a sheet of metal foil, for example.

In a resin composition according to a second aspect of the present disclosure, which may be implemented in conjunction with the first aspect, a semi-cured product of the resin composition has a minimum bending radius equal to or shorter than 2 mm.

The resin composition according to the second aspect may provide a cured product having sufficient flexibility and excellent adhesiveness to a sheet of metal foil, for example.

In a resin composition according to a third aspect of the present disclosure, which may be implemented in conjunction with the first or second aspect, a cured product of the resin composition has a minimum bending radius equal to or shorter than 2 mm.

The resin composition according to the third aspect may provide a cured product having sufficient flexibility and excellent adhesiveness to a sheet of metal foil, for example.

A resin composition according to a fourth aspect of the present disclosure, which may be implemented in conjunction with any one of the first to third aspects, further contains a silane coupling agent (E) having a triazine ring.

The resin composition according to the fourth aspect may provide a cured product having low dielectric properties and yet having excellent adhesiveness to a sheet of metal foil, for example.

In a resin composition according to a fifth aspect of the present disclosure, which may be implemented in conjunction with any one of the first to fourth aspects, a ratio by mass of the styrene block copolymer (B) to a total of the polyphenylene ether compound (A) and the allyl compound (d1) is equal to or greater than 50:50 and equal to or less than 95:5.

The resin composition according to the fifth aspect may provide a cured product having low dielectric properties and yet having sufficient flexibility and excellent adhesiveness to a sheet of metal foil, for example.

In a resin composition according to a sixth aspect of the present disclosure, which may be implemented in conjunction with any one of the first to fifth aspects, content of the polybutadiene compound (C) with respect to 100 parts by mass in total of the polyphenylene ether compound (A) and the allyl compound (d1) is equal to or greater than 5 parts by mass and equal to or less than 40 parts by mass.

The resin composition according to the sixth aspect may provide a cured product having low dielectric properties and yet having sufficient flexibility and excellent adhesiveness to a sheet of metal foil, for example.

A film with resin according to a seventh aspect of the present disclosure includes: a resin layer containing at least one of an uncured product of the resin composition according to any one of the first to sixth aspects or a semi-cured product of the resin composition according to any one of the first to sixth aspects; and a supporting film laid on top of the resin layer.

The seventh aspect may provide a film with resin including a resin layer containing at least one of an uncured product or a semi-cured product of a resin composition, each having low dielectric properties and yet having sufficient flexibility and excellent adhesiveness to a sheet of metal foil, for example. As used herein, the expression "supporting film laid on top of the resin layer" may refer to disposing the resin layer on the supporting film and may also refer to disposing the supporting film on the resin layer, whichever is appropriate.

A sheet of metal foil with resin according to an eighth aspect of the present disclosure includes: a resin layer containing at least one of an uncured product of the resin composition according to any one of the first to sixth aspects or a semi-cured product of the resin composition according to any one of the first to sixth aspects; and a sheet of metal foil laid on top of the resin layer.

The eighth aspect may provide a sheet of metal foil with resin including a resin layer containing at least one of an uncured product or a semi-cured product of a resin composition, each having low dielectric properties and yet having sufficient flexibility and excellent adhesiveness to a sheet of metal foil, for example. As used herein, the expression "sheet of metal foil laid on top of the resin layer" may refer to disposing the resin layer on the sheet of metal foil and may also refer to disposing the sheet of metal foil on the resin layer, whichever is appropriate.

A metal-clad laminate according to a ninth aspect of the present disclosure includes: an insulating layer containing a cured product of the resin composition according to any one of the first to sixth aspects; and a sheet of metal foil laid on top of the insulating layer.

The ninth aspect may provide a metal-clad laminate including an insulating layer containing a cured product of a resin composition having low dielectric properties and yet having sufficient flexibility and excellent adhesiveness to a sheet of metal foil, for example. As used herein, the expression "sheet of metal foil laid on top of the insulating layer" may refer to disposing the insulating layer on the sheet of metal foil and may also refer to disposing the sheet of metal foil on the insulating layer, whichever is appropriate.

A printed wiring board according to a tenth aspect of the present disclosure includes: an insulating layer containing a cured product of the resin composition according to any one of the first to sixth aspects; and wiring covered with the insulating layer.

The tenth aspect may provide a printed wiring board including an insulating layer containing a cured product of a resin composition having low dielectric properties and yet having sufficient flexibility and excellent adhesiveness to a sheet of metal foil, for example.

Examples

Next, specific examples of this embodiment will be described. Note that the examples to be described below are only illustrative examples of this embodiment and should not be construed as limiting.

<Examples 1-9 and Comparative Examples 1 and 2>

The respective components for use to prepare the resin composition in those examples will be described.

(Polyphenylene Ether Compound)

Modified PPE1: a polyphenylene ether compound having a methacryloyl group at one terminal (modified polyphenylene ether produced by modifying a terminal hydroxyl group of polyphenylene ether with a methacryloyl group; a modified polyphenylene ether compound expressed by the formula (14) in which Y is a dimethylmethylene group (i.e., a group expressed by the formula (11) in which $R_{37}$ and $R_{38}$ are methyl groups); SA9000 manufactured by SABIC Innovative Plastics, having a weight average molecular weight Mw of 2000, and having two terminal functional groups); and Modified PPE2: a polyphenylene ether compound having a vinylbenzyl group (ethenylbenzyl group) at a terminal (modified polyphenylene ether produced by allowing polyphenylene ether to react with chloromethylstyrene).

Specifically, this is a modified polyphenylene ether produced by the following reaction:

First, 200 g of polyphenylene ether (SA90 manufactured by SABIC Innovative Plastics, having two terminal hydroxyl groups, and having a weight average molecular weight Mw of 1700); 30 g of a mixture of p-chloromethylstyrene and m-chloromethylstyrene mixed at a mass ratio of 50:50 (chloromethylstyrene (CMS) manufactured by Tokyo Chemical Industry Co., Ltd.); and 1.227 g of tetra-n-butylammonium bromide as a phase transfer catalyst, and 400 g of toluene were introduced into a 1-liter three-necked flask equipped with a temperature controller, a stirrer, a cooling device, and a dropping funnel and stirred up. Then, the polyphenylene ether, chloromethylstyrene, and tetra-n-butylammonium bromide were stirred up until they were dissolved in toluene. At that time, the mixture was gradually heated until the liquid temperature finally reached 75° ° C. Then, an aqueous solution of sodium hydroxide (20 g of sodium hydroxide/20 g of water) was added dropwise as an alkali metal hydroxide to the solution over 20 minutes. After that, the mixture was further stirred at 75° C. for 4 hours. Next, after the contents of the flask were neutralized with 10% by mass of hydrochloric acid, a large amount of methanol was added thereto. In this manner, the liquid in the flask was caused to precipitate. That is to say, the product contained in the reaction liquid in the flask was reprecipitated. Then, this precipitate was extracted by filtration, washed three times with a mixture of methanol and water mixed at a mass ratio of 80:20, and then dried at 80° C. for 3 hours at a reduced pressure.

The solid thus obtained was analyzed by 1H-NMR (400 MHZ, CDCl3, TMS). As a result of NMR measurement, a peak derived from a vinylbenzyl group (ethenylbenzyl group) was observed at a point between 5 ppm and 7 ppm. As a result, it was confirmed that the solid thus obtained was a modified polyphenylene ether having a vinylbenzyl group (ethenylbenzyl group) as the substituent at the terminal of the molecule. Specifically, the solid thus obtained turned out to be an ethenyl-benzylated polyphenylene ether. The modified polyphenylene ether compound thus obtained was a modified polyphenylene ether compound expressed by the formula (13), in which Y was a dimethylmethylene group (i.e., a group expressed by the formula (11) in which $R_{37}$ and $R_{38}$ were methyl groups), Z was a phenylene group, $R_1$ to $R_3$ were hydrogen atoms, and p was 1.

The number of terminal functional groups of the modified polyphenylene ether was measured in the following manner.

First, the modified polyphenylene ether was weighed accurately. The weight at that time is supposed to be X (mg). Then, the modified polyphenylene ether thus weighed was dissolved in 25 mL of methylene chloride, and 100 µL of an ethanol solution of 10% by mass of tetraethylammonium hydroxide (TEAH) (where the ratio by volume of TEAH to ethanol=15:85) was added to the solution. After that, the absorbance (Abs) of the mixture at 318 nm was measured using a UV spectrophotometer (UV-1600 manufactured by Shimadzu Corporation). Then, based on the measurement results, the number of terminal hydroxyl groups of the modified polyphenylene ether was calculated by the following equation:

Number of residual OH groups $$(\mu mol/g) = [(25 \times \text{Abs})/(\varepsilon \times OPL \times X)] \times 10^6$$

where ε indicates an extinction coefficient and is 4700 L/mol·cm and OPL is a cell optical path length and is 1 cm.

Since the number of residual OH groups thus calculated (i.e., the number of terminal hydroxyl groups) of the modified polyphenylene ether was almost zero, the hydroxyl groups of the polyphenylene ether that had not been modified yet turned out to be substantially modified. Thus, the decrease from the number of terminal hydroxyl groups of the polyphenylene ether that had not been modified yet turned out to be the number of terminal hydroxyl groups of the polyphenylene that had not been modified yet. That is to say, the number of terminal hydroxyl groups of the polyphenylene ether that had not been modified yet turned out to be the number of terminal functional groups of the modified polyphenylene ether. In this case, the number of terminal functional groups was two.

The intrinsic viscosity (IV) of the modified polyphenylene ether was also measured in methylene chloride at 25° C. Specifically, the intrinsic viscosity (IV) of the modified polyphenylene ether was measured using a 0.18 g/45 ml methylene chloride solution (liquid temperature: 25° C.) of the modified polyphenylene ether with a viscometer (AVS500 Visco System manufactured by Schott Instruments GmbH). As a result, the intrinsic viscosity (IV) of the modified polyphenylene ether was 0.086 dl/g. In addition, the molecular weight distribution of the modified polyphenylene ether was also measured by gel permeation chromatography (GPC). Then, the weight average molecular weight (Mw) thereof was calculated based on the molecular weight distribution thus obtained. As a result, Mw was 1,900.

(Styrene Block Copolymer)

Tuftec H1041: hydrogenated styrene thermoplastic elastomer (Tuftec H1041 manufactured by Asahi Kasei Corporation); and Tuftec H1221: hydrogenated styrene thermoplastic elastomer (Tuftec H1221 manufactured by Asahi Kasei Corporation).
(Polybutadiene Having Epoxy Group in Molecule)

JP-100: polybutadiene compound having an epoxy group in a molecule (JP-100 manufactured by Nippon Soda Co., Ltd., having an oxirane concentration of 7.7% by mass).
(Curing Agent)

L-DAIC: long-chain alkyl-modified diallyl isocyanurate (L-DAIC manufactured by Shikoku Chemicals Corporation); and TAIC: triallyl isocyanurate (TAIC manufactured by Nippon Kasei Chemical Co., Ltd.)
(Silane Coupling Agent Having Triazine Ring)

VD-5: silane coupling agent having a triazine ring (VD-5 manufactured by Shikoku Chemicals Corporation).
(Others)

Polybutadiene: polybutadiene (B-1000 manufactured by Nippon Soda Co., Ltd., having an oxirane concentration of 0% by mass);

Reaction initiator: α,α'-di(t-butylperoxy) diisopropylbenzene (perbutyl P manufactured by NOF Corporation);

Silane coupling agent: 3-glycidoxypropyltrimethoxysilane (KBM-403 manufactured by Shin-Etsu Chemical Co., Ltd.);

Curing accelerator: 2-ethyl-4-methylimidazole (2E4MZ manufactured by Shikoku Chemicals Corporation); and Filler: spherical silica surface-treated with vinylsilane (SC2300-SVJ manufactured by Admatechs).
(Method for Preparing Resin Composition in the Form of Varnish)

First, respective components other than the filler were added to toluene (solvent) and mixed together to have the composition (parts by mass) shown in Table 1 and a solid content concentration of 60% by mass. The mixture was then stirred up for 60 minutes. After that, the filler was added to the liquid thus prepared and was dispersed with a bead mill. In this manner, a resin composition in the form of varnish was prepared.
(Making Evaluation Board #1)

Next, an evaluation board for use to measure dielectric properties (including relative dielectric constant and dielectric loss tangent), a copper foil peel strength, the minimum bending radius of the semi-cured product, and the minimum bending radius of the cured product was fabricated in the following manner:

First, the resin composition obtained in the form of varnish by the above-described method was applied to a thickness of 75 μm onto a sheet of copper foil (product number: 3EC-VLP manufactured by Mitsui Mining & Smelting Co., Ltd. and having a thickness of 18 μm) and then heated to a temperature of 100-160° C. for 2 to 5 minutes, thereby forming a semi-cured resin layer on the film. In this manner, a sheet of metal foil with resin was obtained.

Then, the same sheet of copper foil as the one used in the previous process step was laid on top of the resin layer of the sheet of metal foil with resin thus obtained. This assembly was used as an object to be pressed and was heated and pressed for 2 hours in a vacuum to a temperature of 200° C. with a pressure of 4 MPa applied to cure the semi-cured resin layer of the sheet of metal foil with resin. The laminate thus fabricated was used as an evaluation board. Note that the cured resin layer on the evaluation board had a thickness of 75 μm.

In addition, as for the evaluation board used for measuring the minimum bending radius of the semi-cured product, the resin layer thereof had not been cured by heating and pressing the assembly for 2 hours in a vacuum to a temperature of 200° ° C. with a pressure of 4 MPa applied, i.e., the resin layer thereof was in a semi-cured state.

The evaluation board thus fabricated was evaluated by the following methods:

[Dielectric Properties (Including Relative Dielectric Constant and Dielectric Loss Tangent)]

The relative dielectric constant and dielectric loss tangent of the evaluation board, from which the sheet of copper foil had been removed, were measured at 10 GHz by cavity resonator perturbation method. Specifically, using a network analyzer (model number: N5230A manufactured by Agilent Technologies), the relative dielectric constant and dielectric loss tangent of the laminate, from which the sheet copper foil of the evaluation board had been removed, were measured at 10 GHZ.

[Copper Foil Peel Strength]

The sheet of copper foil was peeled off from the evaluation board, and the peel strength (copper foil peel strength) at that time was measured in compliance with the JIS C 6481 standard. Specifically, the sheet of copper foil was peeled off from the evaluation board at a rate of 50 mm/min using a tensile tester (model number: SV-52-E-5M manufactured by IMADA-SS Corporation), and the peel strength (N/mm) at that time was measured.

[Minimum Bending Radius of Semi-Cured Product]

A printed wiring board on which an MIT pattern circuit had been formed on the metal foil side of a semi-cured product of the resin composition was provided. Using an MIT test device (model number: MIT-DA manufactured by Toyo Sciki Seisaku-Sho, Ltd.), an R value of a folding clamp to be folded once or more was determined under the measurement conditions including a load of 500 gf, a folding angle of 135 degrees, and a test speed of 175 cpm. The content of the solvent with respect to the entire test piece was 0.8% by mass.

[Minimum Bending Radius of Cured Product]

A printed wiring board on which an MIT pattern circuit had been formed on the metal foil side of a cured product of the resin composition was provided. Using an MIT test device (model number: MIT-DA manufactured by Toyo Seiki Seisaku-Sho, Ltd.), an R value of a folding clamp to be folded once or more was determined under the measurement conditions including a load of 500 gf, a folding angle of 135 degrees, and a test speed of 175 cpm.

(Making Evaluation Board #2)

Subsequently, an evaluation board for use to measure the LCP film peel strength was fabricated in the following manner.

The evaluation board for use to measure the LCP film peel strength was fabricated by laying a film (LCP film, product number: Vecstar CT-Q manufactured by Kuraray Co., Ltd.) on top of the resin layer of the sheet of metal foil with resin obtained while making Evaluation Board #1 described above instead of laying another sheet of copper foil thereon. Then, using the assembly thus fabricated as the object to be pressed. a semi-cured resin layer of the sheet of metal foil with resin was cured by heating and pressing the assembly for 2 hours in a vacuum to a temperature of 200° ° C. with pressure of 4 MPa applied. The laminate thus fabricated was used as an evaluation board. The cured resin layer in this evaluation board also had a thickness of 75 μm. The evaluation board thus fabricated was evaluated by the following methods:

[LCP Film Peel Strength]

The film was peeled off from the evaluation board, and the peel strength (LCP film peel strength) at that time was measured in compliance with the JIS C 6481 standard. Specifically, the LCP film was peeled off from the evaluation board at a rate of 50 mm/min using a tensile tester (model number: SV-52-E-5M manufactured by IMADA-SS Corporation), and the peel strength (N/mm) at that time was measured.

The results of these evaluation tests are summarized in the following Table 1:

TABLE 1

| | | | Ex. 1 | Ex. 2 | Ex. 3 | Ex. 4 | Ex. 5 | Ex. 6 |
|---|---|---|---|---|---|---|---|---|
| Composition | Polyphenylene ether compound | Modified PPE1 | 30 | 30 | 30 | 45 | 25 | — |
| | | Modified PPE2 | — | — | — | — | — | 30 |
| | Styrene block copolymer | Tuftec H1041 | 40 | 40 | 40 | 10 | 50 | — |
| | | Tuftec H1221 | — | — | — | — | — | 40 |
| | Polybutadiene having epoxy group in molecule | JP-100 | 4 | 10 | 20 | 10 | 10 | 10 |
| | Curing agent | L-DAIC | 30 | 30 | 30 | 45 | 25 | 30 |
| | | TAIC | — | — | — | — | — | — |
| | Polybutadiene | B-1000 | — | — | — | — | — | — |
| | Silane coupling agent having triazine group | VD-5 | 1 | 1 | 1 | 1 | 1 | 1 |
| | Silane coupling agent | KBM-403 | — | — | — | — | — | — |
| | Reaction initiator | perbutyl P | 1 | 1 | 1 | 1 | 1 | 1 |
| | Curing accelerator | 2E4MZ | 0.1 | 0.1 | 0.1 | 0.1 | 0.1 | 0.1 |
| | Filler | SC2300-SVJ | 250 | 250 | 250 | 250 | 250 | 250 |
| Evaluation | Relative dielectric constant | | 2.77 | 2.77 | 2.86 | 2.87 | 2.76 | 2.78 |
| | Dielectric loss tangent | | 0.0021 | 0.0022 | 0.004 | 0.0024 | 0.0021 | 0.0025 |
| | Copper foil peel strength (N/mm) | | 0.54 | 0.67 | 0.60 | 0.55 | 0.75 | 0.6 |
| | LCP film peel strength (N/mm) | | 0.39 | 0.45 | 0.43 | 0.38 | 0.65 | 0.43 |
| | Minimum bending radius (mm) of semi-cured product | | <0.38 | 0.38 | <0.38 | <0.38 | <0.38 | <0.38 |
| | Minimum bending radius (mm) of cured product | | <0.38 | <0.38 | <0.38 | 2 | <0.38 | <0.38 |

| | | | Ex. 7 | Ex. 8 | Ex. 9 | Cmp. Ex. 1 | Cmp. Ex. 2 |
|---|---|---|---|---|---|---|---|
| Composition | Polyphenylene ether compound | Modified PPE1 | 30 | 30 | 30 | 48 | 30 |
| | | Modified PPE2 | — | — | — | — | — |
| | Styrene block copolymer | Tuftec H1041 | 40 | 40 | 40 | 40 | 10 |
| | | Tuftec H1221 | — | — | — | — | — |
| | Polybutadiene having epoxy group in molecule | JP-100 | 10 | 10 | 10 | 10 | — |
| | Curing agent | L-DAIC | 25 | 30 | 30 | — | 30 |
| | | TAIC | 5 | — | — | 12 | — |
| | Polybutadiene | B-1000 | — | — | — | — | 10 |
| | Silane coupling agent having triazine group | VD-5 | 1 | — | — | 1 | 1 |
| | Silane coupling agent | KBM-403 | — | — | 1 | — | — |
| | Reaction initiator | perbutyl P | 1 | 1 | 1 | 1 | 1 |
| | Curing accelerator | 2E4MZ | 0.1 | 0.1 | 0.1 | 0.1 | |
| | Filler | SC2300-SVJ | 250 | 250 | 250 | 250 | 250 |
| Evaluation | Relative dielectric constant | | 2.69 | 2.71 | 2.7 | 2.84 | 2.76 |
| | Dielectric loss tangent | | 0.0024 | 0.0023 | 0.0024 | 0.0027 | 0.0014 |
| | Copper foil peel strength (N/mm) | | 0.65 | 0.6 | 0.51 | 0.56 | 0.55 |
| | LCP film peel strength (N/mm) | | 0.41 | 0.35 | 0.28 | 0.43 | 0.2 |
| | Minimum bending radius (mm) of semi-cured product | | <0.38 | <0.38 | <0.38 | >10.0 | <0.38 |
| | Minimum bending radius (mm) of cured product | | <0.38 | <0.38 | <0.38 | 1 | <0.38 |

As can be seen from Table 1, Examples 1 to 9 produced more desirable results in the minimum bending test of the semi-cured product than Comparative Example 1 in which L-DAIC was not used.

In addition, Examples 1 to 3 and 5 to 9 produced more desirable results in the minimum bending test of the cured product than Comparative Example 1 in which L-DAIC was not used.

Furthermore, in Examples 2, 3 and 5 to 8, the copper foil peel strength was higher than in Comparative Example 2 in which polybutadiene having no epoxy group was contained instead of the polybutadiene compound having an epoxy group in its molecule.

Besides, in Examples 1 to 9, the LCP film peel strength was higher than in Comparative Example 2 in which polybutadiene having no epoxy group was contained instead of the polybutadiene compound having an epoxy group in its molecule.

In Examples 1 to 7, the LCP film peel strength was higher than in Examples 8 and 9 containing no silane coupling agent having a triazine ring. Thus, it can be said that the silane coupling agent is preferably a silane coupling agent having a triazine ring.

As can be seen from the foregoing description, the resin composition according to this embodiment enables providing a cured product having low dielectric properties and yet having sufficient flexibility and excellent adhesiveness to a sheet of metal foil, for example. In addition, this embodiment also provides a film with resin, a sheet of metal foil with resin, a metal-clad laminate, and a printed wiring board, each of which includes a cured product made out of the resin composition.

While the foregoing has described what are considered to be the best mode and/or other examples, it is understood that various modifications may be made therein and that the subject matter disclosed herein may be implemented in various forms and examples, and that they may be applied in numerous applications, only some of which have been described herein. It is intended by the following claims to claim any and all modifications and variations that fall within the true scope of the present teachings.

The invention claimed is:

1. A resin composition containing
a polyphenylene ether compound (A),
a styrene block copolymer (B),
a polybutadiene compound (C),
a curing agent (D), and
a silane coupling agent (E) having a triazine ring,
the polyphenylene ether compound (A) having, in a molecule thereof, at least one of a group expressed by the following formula (1) or a group expressed by the following formula (2):

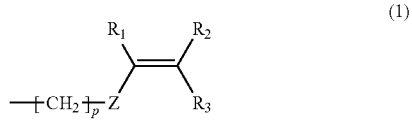 (1)

where p indicates an integer falling within a range from 0 to 10, Z indicates an arylene group, and $R_1$ to $R_3$ each independently indicate either a hydrogen atom or an alkyl group,

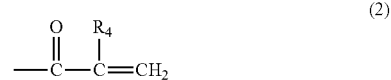 (2)

where $R_4$ indicates either a hydrogen atom or an alkyl group,
the polybutadiene compound (C) having an epoxy group in a molecule thereof, and
the curing agent (D) containing an allyl compound (d1) expressed by the following formula (3):

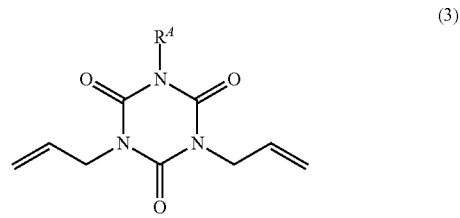 (3)

where $R^A$ indicates either an alkyl group or an alkenyl group, each having 8 to 22 carbon atoms.

2. The resin composition of claim 1, wherein
a ratio by mass of the styrene block copolymer (B) to a total of the polyphenylene ether compound (A) and the allyl compound (d1) is equal to or greater than 50:50 and equal to or less than 95:5.

3. The resin composition of claim 1, wherein
content of the polybutadiene compound (C) with respect to 100 parts by mass in total of the polyphenylene ether compound (A) and the allyl compound (d1) is equal to or greater than 5 parts by mass and equal to or less than 40 parts by mass.

4. A semi-cured product of the resin composition of claim 1, wherein
the semi-cured product of the resin composition having a thickness of 75 μm and being obtained by heating the resin composition at a temperature of 100° C. to 160° C. for 2 to 5 minutes has a minimum bending radius equal to or shorter than 2 mm,
the minimum bending radius of the semi-cured product refers to an R value of a folding clamp obtained by subjecting the semi-cured product made of the resin composition to an MIT test compliant with the JIS P8115 standard with the semi-cured product folded once or more under a measuring condition including a load of 0.5 kgf, a bending angle of 135 degrees, and a test rate of 175 cpm.

5. A cured product of the resin composition of claim 1, wherein
the cured product of the resin composition having a thickness of 75 μm and being obtained by heating the resin composition at a temperature of 100° C. to 160° C. for 2 to 5 minutes, and then heating and pressurizing for 2 hours under the condition of 200° C. and pressure 4 MPa has a minimum bending radius equal to or shorter than 2 mm,
the minimum bending radius of the cured product refers to an R value of a folding clamp obtained by subjecting the cured product made of the resin composition to an MIT test compliant with the JIS P8115 standard with the cured product folded once or more under a measuring condition including a load of 0.5 kgf, a bending angle of 135 degrees, and a test rate of 175 cpm.

6. A film with resin, comprising:
a resin layer containing at least one of
- an uncured product of the resin composition of claim 1 or
- a semi-cured product of the resin composition of claim 1; and a supporting film laid on top of the resin layer.

7. A sheet of metal foil with resin, comprising:
a resin layer containing at least one of
- an uncured product of the resin composition of claim 1 or
- a semi-cured product of the resin composition of claim 1; and a sheet of metal foil laid on top of the resin layer.

8. A metal-clad laminate comprising:
an insulating layer containing a cured product of the resin composition of claim 1; and
a sheet of metal foil laid on top of the insulating layer.

9. A printed wiring board comprising:
an insulating layer containing a cured product of the resin composition of claim 1; and
wiring covered with the insulating layer.

\* \* \* \* \*